(12) United States Patent
Hayakawa et al.

(10) Patent No.: US 9,444,044 B2
(45) Date of Patent: Sep. 13, 2016

(54) RESISTIVE NONVOLATILE STORAGE DEVICE, MANUFACTURING METHOD FOR SAME, AND RESISTIVE NONVOLATILE STORAGE APPARATUS

(71) Applicant: Panasonic Intellectual Property Management Co., Ltd., Osaka (JP)

(72) Inventors: Yukio Hayakawa, Kyoto (JP); Yoshio Kawashima, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/642,957

(22) Filed: Mar. 10, 2015

(65) Prior Publication Data
US 2015/0263279 A1    Sep. 17, 2015

(30) Foreign Application Priority Data

Mar. 17, 2014 (JP) .................................. 2014-053051
Nov. 14, 2014 (JP) .................................. 2014-232103

(51) Int. Cl.
*H01L 45/00* (2006.01)
*H01L 27/24* (2006.01)

(52) U.S. Cl.
CPC ....... *H01L 45/1253* (2013.01); *H01L 27/2409* (2013.01); *H01L 27/2436* (2013.01); *H01L 27/2481* (2013.01); *H01L 45/08* (2013.01); *H01L 45/1233* (2013.01); *H01L 45/146* (2013.01); *H01L 45/1625* (2013.01); *H01L 45/1675* (2013.01)

(58) Field of Classification Search
CPC ........... H01L 45/1253; H01L 27/2409; H01L 27/2436; H01L 45/1233; H01L 45/146; H01L 45/1675
See application file for complete search history.

(56) References Cited

U.S. PATENT DOCUMENTS

| | | | |
|---|---|---|---|
| 2006/0088947 A1* | 4/2006 | Lien .................. | H01L 21/76834 438/3 |
| 2009/0283736 A1 | 11/2009 | Kanzawa et al. | |
| 2012/0161095 A1 | 6/2012 | Mikawa et al. | |
| 2013/0178042 A1* | 7/2013 | Ninomiya ............... | H01L 45/08 438/382 |
| 2014/0063913 A1* | 3/2014 | Kawashima ....... | G11C 13/0007 365/148 |

(Continued)

FOREIGN PATENT DOCUMENTS

| | | |
|---|---|---|
| JP | 2006-269480 | 10/2006 |
| JP | 2006-303544 | 11/2006 |
| JP | 2008-518469 | 5/2008 |

(Continued)

*Primary Examiner* — Fernando L Toledo
*Assistant Examiner* — Neil Prasad
(74) *Attorney, Agent, or Firm* — McDermott Will & Emery LLP

(57) ABSTRACT

A resistive nonvolatile storage device includes a first interlayer insulating layer provided above a substrate, a contact hole penetrating through the first interlayer insulating layer, a contact layer wholly covering a bottom surface and a sidewall surface of the contact hole and extending to at least partially cover an upper surface of the first interlayer insulating layer, a contact plug filled in the contact hole, an upper surface of the contact plug being positioned below an upper surface of the contact layer, a lower electrode provided on both the contact plug and the contact layer that is provided on the part of the upper surface of the first interlayer insulating layer, and a resistance change layer provided on the lower electrode, and an upper electrode that is provided on the resistance change layer.

5 Claims, 17 Drawing Sheets

(56) References Cited

U.S. PATENT DOCUMENTS

2014/0175369 A1* 6/2014 Murase .................. H01L 45/08
257/4

FOREIGN PATENT DOCUMENTS

| WO | 2008/149484 | 12/2008 |
| WO | 2011/024455 | 3/2011 |

* cited by examiner

RESISTIVE NONVOLATILE STORAGE DEVICE, MANUFACTURING METHOD FOR SAME, AND RESISTIVE NONVOLATILE STORAGE APPARATUS

BACKGROUND

1. Technical Field

The present disclosure relates to a resistive nonvolatile storage device of which resistance value is changed with application of an electric pulse, and to a manufacturing method for the resistive nonvolatile storage device. The present disclosure further relates to a resistive nonvolatile storage apparatus using the plurality of resistive nonvolatile storage devices.

2. Description of the Related Art

Recently, functions of electronic equipment, such as portable information devices and intelligent home appliances, have become increasingly sophisticated with development of the digital technology. Corresponding to the sophistication in functions of the electronic equipment, miniaturization and speedup of semiconductor elements used in the electronic equipment have also been progressed at a high pace. Such a trend has quickly expanded applications of large-capacity nonvolatile memories represented by a flash memory. Furthermore, research and development of a ReRAM (Resistive Random Access Memory) using a resistive nonvolatile storage device has been progressed as a novel nonvolatile memory that is to be replaced with the flash memory. Here, the term "resistive nonvolatile storage device" implies an element having properties to reversibly change its resistance value in accordance with an electric signal, and being able to non-volatilely store information corresponding to the resistance value.

In the above-mentioned resistive random access memory, a resistance change layer of which resistance value is changed is used as a storage element. By applying an electric pulse (e.g., a voltage pulse) to the resistance change layer, the resistance value of the resistance change layer is changed from a high resistance state to a low resistance state, or from a low resistance state to a high resistance state. On that occasion, by storing data such that the low resistance state corresponds to "1" and the high resistance state corresponds to "0", resistive random access memory can be operated to function as a binary memory. In such a case, it is desirable to distinctively discriminate binary values corresponding to the low resistance state and the high resistance state, to stably cause change between the low resistance state and the high resistance state at a high speed, and to hold the binary values in a nonvolatile fashion.

As one example of the above-described resistive nonvolatile storage device, there is proposed a resistive nonvolatile storage device using a resistance change layer that is in the multilayer form of transition metal oxides having different oxygen contents. For example, International Publication No. 2008/149484 discloses a technique that stabilizes a resistance change phenomenon by selectively generating an oxidation reaction and a reduction reaction at an interface between a transition metal oxide layer having a high oxygen content and an electrode disposed in contact with the transition metal oxide layer.

SUMMARY

In one general aspect, the techniques disclosed here feature a resistive nonvolatile storage device including a first interlayer insulating layer provided above a substrate, a contact hole penetrating through the first interlayer insulating layer, a contact layer wholly covering a bottom surface and a sidewall surface of the contact hole and extending to at least partially cover an upper surface of the first interlayer insulating layer, a contact plug filled in the contact hole, an upper surface of the contact plug being positioned below an upper surface of the contact layer, a lower electrode provided on both the contact plug and the contact layer that is provided on the part of the upper surface of the first interlayer insulating layer, and a resistance change layer provided on the lower electrode, and an upper electrode that is provided on the resistance change layer.

With the resistive nonvolatile storage element according to one embodiment of the present disclosure, variations in characteristics of the individual resistive nonvolatile storage elements can be reduced.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Underlying Knowledge Forming Basis of the Present Disclosure

The resistive nonvolatile storage element of the related art has the problem that, when the many resistive nonvolatile storage elements are arranged in the form of a memory array, variations in characteristics of the resistive nonvolatile storage elements are increased in an end portion of the memory array, and the number of failed bits is increased in the end portion.

One non-limiting and exemplary embodiment provides a resistive nonvolatile storage element capable of, when the many resistive nonvolatile storage elements are arranged in the form of a memory array, reducing variations in characteristics of the resistive nonvolatile storage elements, which may be generated in an end portion of the memory array, a manufacturing method for the resistive nonvolatile storage element, or a resistive nonvolatile storage device using the plurality of resistive nonvolatile storage elements.

The inventors have conducted intensive studies with intent to reduce variations in characteristics of a large-capacity resistive nonvolatile storage apparatus. As a result, the inventors have attained the following knowledge. It is to be noted that the following knowledge is merely to aid understanding of embodiments described later. Thus, the present disclosure is not limited to the knowledge described below.

Realization of the large-capacity resistive nonvolatile storage apparatus necessitates the use of a memory array allowing the resistive nonvolatile storage apparatus, which is made up of many resistive nonvolatile storage devices, to be arranged in a minimum area. The resistive nonvolatile storage elements arranged in the memory array are demanded to have smaller variations in characteristics of not only the individual resistive nonvolatile storage devices themselves, but also among those resistive nonvolatile storage devices. The reason is that, as the capacity of the memory array increases, the variations in characteristics of the resistive nonvolatile storage devices cause greater influences upon characteristics of the entire memory array.

However, when the resistive nonvolatile storage devices are arranged in the form of the memory array, there is a problem that different type variations in characteristics are generated as follows.

Figure 23:
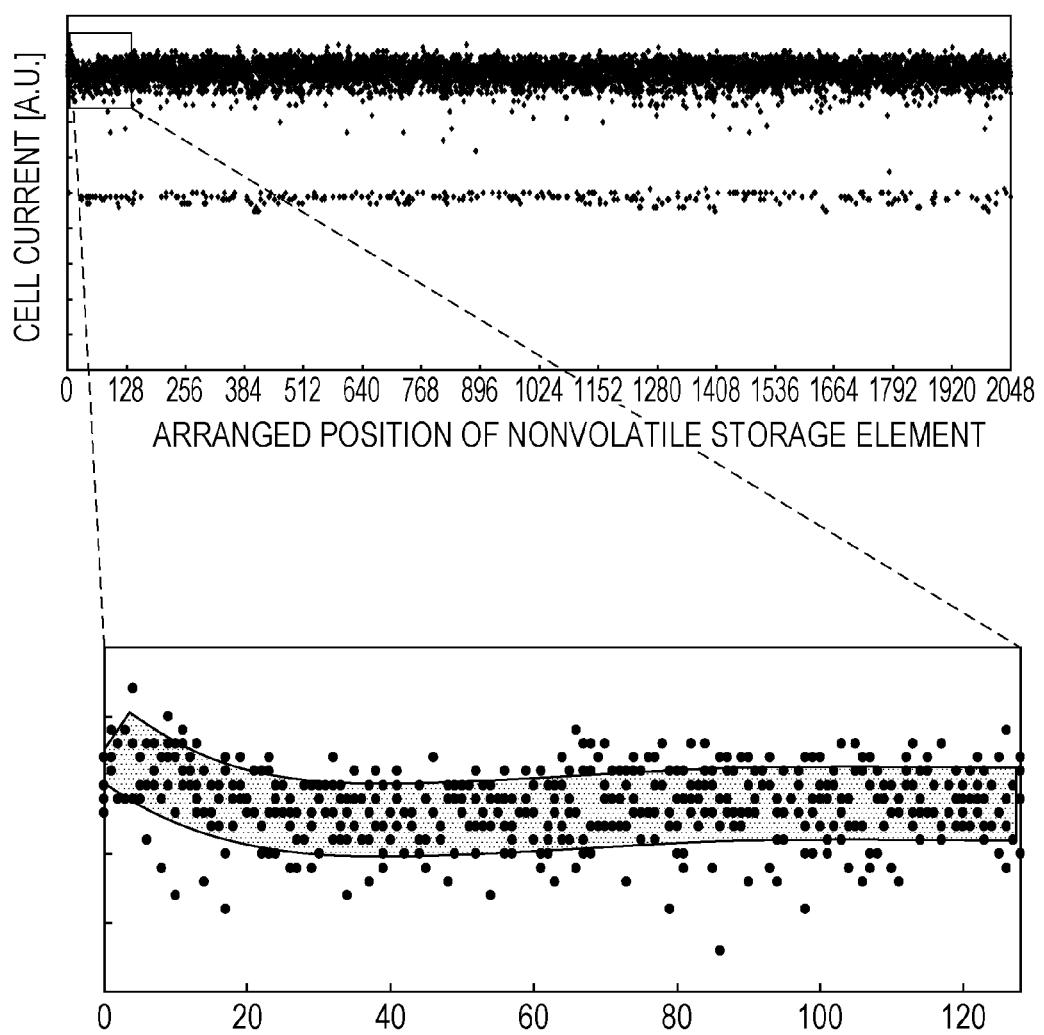
FIG. 23 is a characteristic graph representing dependency of failed bits upon arrangement when resistive nonvolatile storage devices of related art are arranged in the form of a memory array.

FIG. 23 is a characteristic graph representing dependency of failed bits upon arrangement when resistive nonvolatile storage devices of related art are arranged in the form of a memory array. In FIG. 23, the horizontal axis represents an arranged position of the resistive nonvolatile storage device within a memory array region when the resistive nonvolatile storage devices are arranged in the form of the memory array. The vertical axis represents a current flowing through the resistive nonvolatile storage device at the arranged position. A left end of the horizontal axis in FIG. 23 corresponds to a boundary of the memory array region (i.e., an end of the memory array region), and a point on the horizontal axis gradually shifting rightwards represents a position gradually departing away from the boundary of the memory array region (i.e., a position gradually approaching a center of the memory array region). More specifically, the vertical axis represents a current (relative value in terms of A. U.) flowing through the resistive nonvolatile storage device when the resistive nonvolatile storage device is brought into a high resistance (HR) state and a low resistance (LR) state (see an upper chart in FIG. 23), and a current, in enlarged scale, flowing through the resistive nonvolatile storage device when it is brought into the LR state (see a lower chart in FIG. 23). As seen from FIG. 23, the current flowing through the resistive nonvolatile storage device in the LR state is increased in a boundary portion of the memory array region (i.e., a left end portion in FIG. 23). In other words, variations in characteristics of the resistive nonvolatile storage devices are increased in the boundary portion of the memory array region. For example, in trying to increase the memory capacity while the size of each resistive nonvolatile storage device is maintained the same, an area of the memory array region is increased. Accordingly, the boundary portion of the memory array region is also increased, and the above-mentioned variations in characteristics appear more significantly in the boundary portion of the memory array region.

Figure 25:
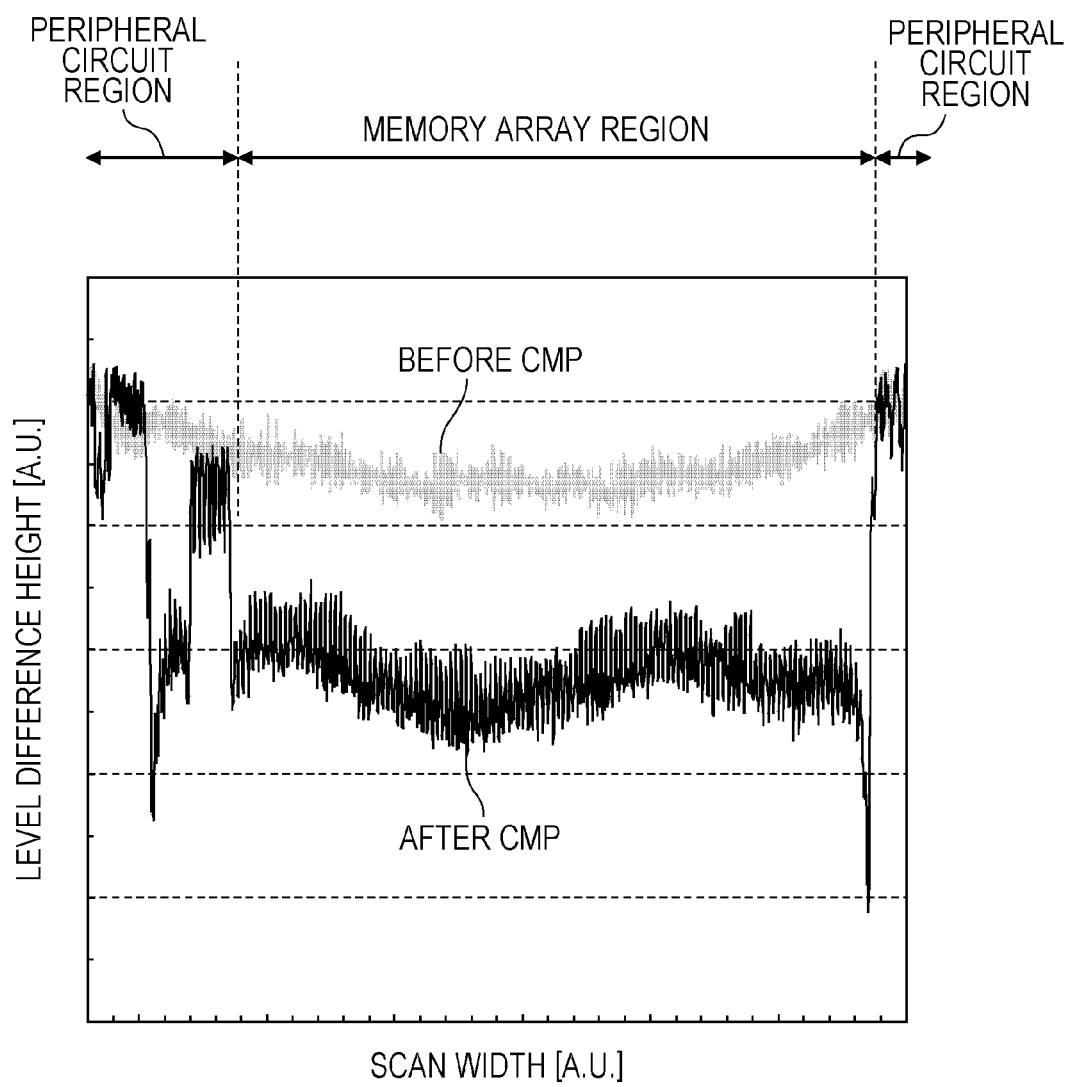
FIG. 25 is a characteristic graph representing a measurement result of a level difference between before and after CMP (Chemical Mechanical Polishing).

FIG. 25 is a characteristic graph illustrating a measurement result of surface unevenness between before and after CMP (Chemical Mechanical Polishing) regarding respective surfaces of contact plugs present in the above-mentioned memory array region and an interlayer insulating film formed to surround the contact plugs. The unevenness is measured by employing a contact-type level difference gauge. In FIG. 25, the horizontal axis represents the memory array region and peripheral circuit regions (including a memory cell control circuit, etc.) positioned adjacent to the memory array region. The vertical axis represents the surface unevenness (level difference height) in each of those regions. As seen from a chart denoted by "After CMP" in FIG. 25, the surface height of the memory array region is recessed from those of the adjacent peripheral circuit regions (such a height difference is also called a "global level difference" in some cases). In particular, a steeply-falling recess is observed in the boundary portion of the memory array region. This is attributable to a phenomenon that amounts by which the contact plugs are polished by the CMP depend on an area of the exposed contact plugs (so-called pattern density). For example, when the memory capacity is increased by reducing the size of each resistive nonvolatile storage device, the pattern density in the memory array region is further increased, and an influence of the pattern density attributable to the polishing is more significant.

For example, within the memory array region where the contact plugs are arranged at a high density, an exposure rate of metal (i.e., the contact plugs) occupying the memory array region is increased. On the other hand, outside the memory array region, the exposure rate of metal (i.e., the contact plugs) occupying the memory array region is reduced and an exposure rate of the interlayer insulating film is increased. Thus, a polishing rate by the CMP is higher in the memory array region where the exposure rate of metal (i.e., occupancy of the contact plugs) is higher than in the region outside the memory array region. Accordingly, a particularly large level difference (i.e., a large difference in height of a surface position) is generated in the boundary portion between the two regions subjected to different polishing rates (i.e., in the end portion of the memory array region). Even when a lower electrode layer is formed on both the contact plugs and the interlayer insulating film and a surface of the lower electrode layer is polished by CMP, it is difficult to eliminate a similar recess in the interlayer insulating film at a position located farther away from the boundary portion of the memory array region toward the inner side thereof. The above-described level difference and recess become main factors causing variations in electric field distribution within the resistive nonvolatile storage device when the resistive nonvolatile storage device is operated to change its resistance, thereby increasing variations in characteristics of the entire memory array. Such an increase in characteristic variations increases the number of failed bits.

However, CMP is a necessarily employed technique in a process of manufacturing the large-capacity resistive nonvolatile storage apparatus. Accordingly, a process technique is demanded which can reduce the level difference in the end portion of the memory array region and the recess in the surface of the interlayer insulating film (i.e., the global level difference) even when the CMP is performed.

The present disclosure is to reduce the number of failed bits that are generated in the end portion of the memory array region when the resistive nonvolatile storage devices are arranged in the form of the memory array, and to provide the large-capacity resistive nonvolatile storage apparatus using the many resistive nonvolatile storage devices.

The resistive nonvolatile storage apparatus according to embodiments of the present disclosure will be described below with reference to the drawings.

It is to be noted that the following embodiments represent specific examples of the present disclosure. Numerical values, shapes, materials, components, arrangement positions and connection forms of the components, steps, sequences of steps, and so on, which are described in the following embodiments, are merely illustrative, and they are not purported to limit the present disclosure. Among the components in the following embodiments, those ones other than the components not stated in independent claims, which define most significant concepts, are described as optional components constituting the embodiments. Descriptions of the components denoted by the same reference symbols in the drawings are not repeated in some cases. The drawings are intended to depict the components in a schematic manner for easier understanding, and shapes, dimensional ratios, etc. are not exactly depicted in some cases. In manufacturing methods, the sequence of individual steps, etc. may be changed depending on practical demands, and other known steps may be added optionally.

First Embodiment

A resistive nonvolatile storage device according to a first aspect includes: a first interlayer insulating layer provided above a substrate; a contact hole penetrating through the first interlayer insulating layer; a contact layer wholly covering a bottom surface and a sidewall surface of the contact hole and extending to at least partially cover an upper surface of the first interlayer insulating layer; a contact plug filled in the contact hole, an upper surface of the contact plug being positioned below an upper surface of the contact layer that is provided along the upper surface of the first interlayer insulating layer; a lower electrode provided on both the contact plug and the contact layer that is provided along the upper surface of the first interlayer insulating layer; and a resistance change layer provided on the lower electrode, resistance of the resistance change layer changing in accordance with a voltage applied between the lower electrode and an upper electrode; and the upper electrode that is provided on the resistance change layer.

With the features described above, in the case of the resistive nonvolatile storage devices being arranged in the form of a memory array, even when polishing (e.g., CMP) of a conductive layer, which constitutes a plug material, is performed in a step of forming the contact plugs, the conductive layer is polished in a state where the close contact layer covering a part of the upper surface of the interlayer insulating layer remains, on which part the contact plug is formed. Accordingly, the interlayer insulating layer is not polished, and surface unevenness (so-called global level difference), including the level difference in the end portion of the memory array region and the recess in the surface of the interlayer insulating layer, can be suppressed.

As a result, variations in characteristics of a large-capacity resistive nonvolatile storage apparatus, which employs many resistive nonvolatile storage devices, can be reduced.

The resistive nonvolatile storage device described above may further include a second interlayer insulating layer provided between the substrate and the first interlayer insulating layer; a first wiring provided in the second interlayer insulating layer except an upper surface thereof; and a second wiring connected to the upper electrode. The first wiring is in contact with a bottom surface of the contact layer.

A side surface of the contact layer may be present in a same plane as respective side surfaces of the lower electrode, the resistance change layer, and the upper electrode.

The contact plug may be made of copper.

A film thickness of the lower electrode may be larger in a region of the lower electrode above the contact plug than in a region of the lower electrode above the contact layer, and an upper surface of the lower electrode in contact with the resistance change layer is flat.

Each of the contact layer and the lower electrode may include a nitride.

Each of the contact layer and the lower electrode may include a nitride of a same transition metal.

The lower electrode may have a multilayer structure.

The resistance change layer may include a metal oxide.

The resistance change layer may include a plurality of metal oxide layers each having different oxygen content.

The plurality of metal oxide layers comprise metal oxides of different metals.

The plurality of metal oxide layers comprise metal oxides of a same metal.

The resistance change layer may include an oxygen-deficient transition metal oxide.

The resistance change layer may have a multilayer structure of two or more layers having different oxygen contents.

The resistance change layer may include a tantalum oxide.

The resistance change layer includes a first resistance change layer comprising a first tantalum oxide, and a second resistance change layer comprising a second tantalum oxide, The first tantalum oxide is expressed by $TaO_x$ and the second tantalum oxide is expressed by $TaO_y$, following conditions are satisfied:

$0.8 \leq x \leq 1.9$, and $x < y$.

According to the first embodiment, there is also provided a manufacturing method for a resistive nonvolatile storage device including a resistance change element including an upper electrode, a resistance change layer, and a lower electrode, the resistance change layer being provided between the upper electrode and the lower electrode, resistance of the resistance change layer changing in accordance with a voltage applied between the lower electrode and an upper electrode, the method comprising: forming a first interlayer insulating layer above a substrate; opening a contact hole through the first interlayer insulating layer; forming a contact layer along a bottom surface and a sidewall of the contact hole and along an upper surface of the first interlayer insulating layer; depositing a conductive layer on the contact layer; polishing the conductive layer until an upper surface of the contact layer is positioned below an upper surface of the contact layer on the upper surface of the first interlayer insulating layer, to expose an upper surface of the contact layer, which is formed on the upper surface of the first interlayer insulating layer and to expose an upper surface of the conductive layer in the contact hole; forming a lower electrode layer on the exposed contact layer and on a contact plug that is composed of the conductive layer in the contact hole; after forming the lower electrode layer, polishing an upper surface of the lower electrode layer until a film thickness of the lower electrode layer is larger in a region of the lower electrode layer above the contact plug than in a region of the lower electrode layer above the contact layer, and planarizing an upper surface of the lower electrode layer, the upper surface of the lower electrode layer being in contact with the resistance change layer; forming a resistance change film layer on the planarized lower electrode layer; forming an upper electrode layer on the resistance change film; and forming the resistance change element by simultaneously etching the upper electrode layer, the resistance change film layer, the lower electrode layer, and the contact layer, thereby respective side surfaces of the upper electrode, the resistance change layer, the lower electrode, and the contact layer are present in a same plane.

With the features described above, in the case of the resistive nonvolatile storage devices being arranged in the form of a memory array, even when polishing (e.g., CMP) of the conductive layer, which constitutes a plug material, is performed in a step of forming the contact plugs, the conductive layer is polished in a state where the close contact layer covering a part of the upper surface of the interlayer insulating layer remains, on which part the contact plug is formed. Accordingly, the interlayer insulating layer is not polished, and surface unevenness (so-called global level difference), including the level difference in the end portion of the memory array region and the recess in the surface of the interlayer insulating layer, can be suppressed. As a result, variations in characteristics of a large-capacity resistive nonvolatile storage apparatus, which employs many resistive nonvolatile storage devices, can be reduced.

The manufacturing method for the resistive nonvolatile storage device may further include, before forming the first interlayer insulating layer, forming a second interlayer insulating layer on the substrate; and forming a first wiring in the second interlayer insulating layer except an upper surface thereof, and after forming the resistance change layer, forming a second wiring connected to the upper electrode. In the forming the contact layer, the contact layer is formed on the first wiring, the upper surface of the first wiring being in contact with a bottom surface of the contact layer.

The forming the lower electrode layer may include: depositing a first lower electrode layer on both the contact layer and the conductive layer; polishing an upper surface of the first lower electrode layer to planarize the upper surface of the lower electrode layer; and depositing a second lower electrode layer on the planarized first lower electrode layer.

In the forming the resistance change element, the upper electrode layer, the resistance change film layer, the lower electrode layer, and the contact layer may be simultaneously etched, thereby the contact layer at least partially covering the upper surface of the first interlayer insulating layer.

The forming the resistance change layer may include: forming a first metal oxide layer comprising an oxygen-deficient metal oxide; and forming a second metal oxide layer having a lower degree of oxygen deficiency than oxygen deficiency of the first metal oxide layer.

The forming the first wiring may include: forming a first wiring groove in the second interlayer insulating layer; and burying a first wiring material in the first wiring groove. The forming the second wiring may include: forming a third interlayer insulating layer on a side surface and an upper surface of the resistance change element, and on the first interlayer insulating layer; forming a second wiring groove in the third interlayer insulating layer; and burying a second wiring material in the second wiring groove.

[Configuration of Resistive Nonvolatile Storage Device]

Figure 1:
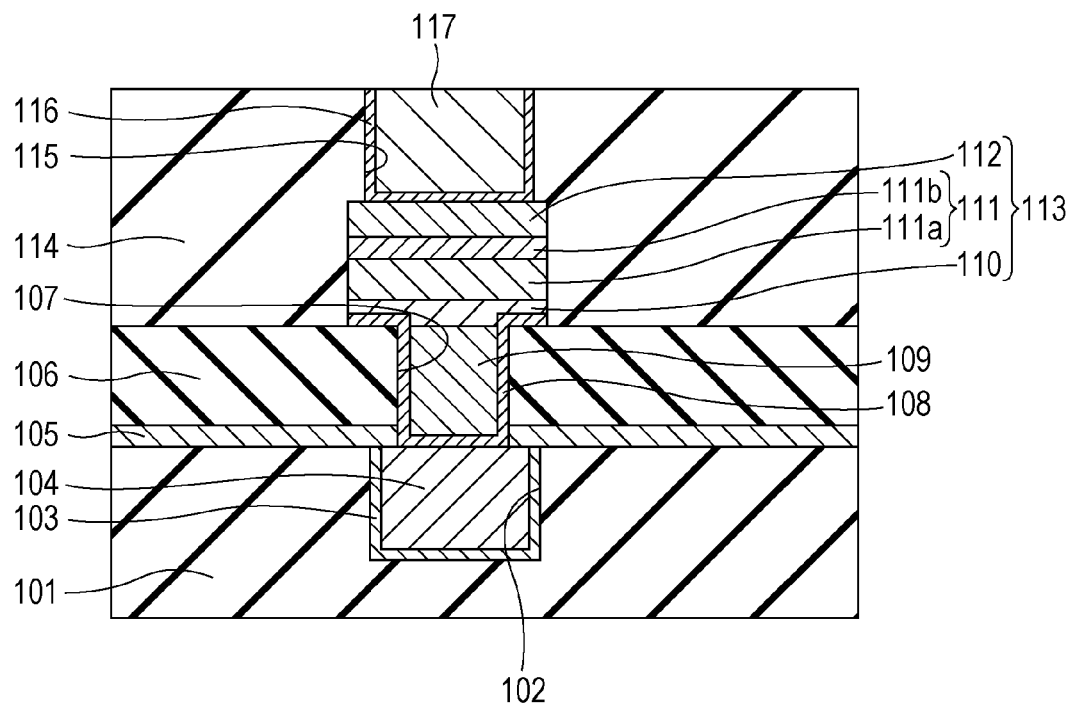
FIG. 1 is a sectional view illustrating one example of a basic configuration of a resistive nonvolatile storage device according to a first embodiment.

FIG. 1 is a sectional view illustrating one example of a basic configuration of a resistive nonvolatile storage device 10 according to the first embodiment.

In FIG. 1, a resistive nonvolatile storage device disposed in the so-called memory array in a general resistive nonvolatile storage apparatus is illustrated as the resistive nonvolatile storage device 10. For simplicity of explanation, FIG. 1 illustrates only one resistive nonvolatile storage device (1 bit) in the memory array. The resistive nonvolatile storage device 10 may be associated with, in addition to the memory array, a drive circuit for driving the memory array.

The resistive nonvolatile storage device 10 according to this embodiment includes, as main components, a first interlayer insulating layer (interlayer insulating layer 106) formed above a substrate, a contact hole 107 penetrating through the first interlayer insulating layer, a close contact layer (second close contact layer 108) covering a sidewall and a bottom surface of the contact hole 107 and a part of an upper surface of the first interlayer insulating layer, a contact plug 109 filled in the contact hole 107 and positioned below an upper surface of the close contact layer, a lower electrode 110 formed on both the contact plug 109 and the close contact layer that covers the part of the upper surface of the first interlayer insulating layer, a resistance change layer 111 formed on the lower electrode 110, and an upper electrode 112 formed on the resistance change layer 111. The resistive nonvolatile storage device 10 includes other optional components in addition to the above-described main components. The main components and the other optional components of the resistive nonvolatile storage device 10 according to this embodiment will be described below.

An interlayer insulating layer 101 is formed on a semiconductor substrate (not illustrated) on which transistors, etc. are formed, and it is made of a silicon oxide, for example. The interlayer insulating film 101 corresponds to a second interlayer insulating layer formed between the substrate and the first interlayer insulating layer.

A first wiring groove 102 is formed in the interlayer insulating layer 101, and a first close contact layer 103 and a first metal wiring 104 are formed in the first wiring groove 102. The first metal wiring 104 corresponds to a first wiring that is formed in the second interlayer insulating layer in a state having an exposed surface. Here, the first close contact layer 103 is a metal layer that makes the first metal wiring 104 reliably closely contacted with lateral and bottom surfaces of the first wiring groove 102. The first close contact layer 103 has a multilayer structure of, e.g., a tantalum nitride (having a film thickness of not less than 5 nm and not more than 40 nm) and tantalum (having a film thickness of not less than 5 nm and not more than 40 nm). The first metal wiring 104 is formed of a copper wire. The first metal wiring 104 may be made of a metal (e.g., aluminum) other than copper.

A liner layer 105 is formed to cover at least the exposed surface of the first metal wiring 104. On that occasion, the liner layer 105 may be formed on an exposed surface of the first close contact layer 103 and on the interlayer insulating layer 101 as well. The liner layer 105 is made of, e.g., silicon nitride (Si N) or silicon carbonitride (SiCN) (having a film thickness of not less than 20 nm and not more than 100 nm, for example). The liner layer 105 functions as an insulating film to avoid oxidation of the exposed surface of the first metal wiring 104.

The interlayer insulating layer 106 (first interlayer insulating layer) is formed on the liner layer 105, and it is made of, e.g., a silicon oxide (having a film thickness of not less than 100 nm and not more than 500 nm). The interlayer insulating layer 106 corresponds to the first interlayer insulating layer formed above the substrate.

The contact hole 107 (having a diameter of 50 to 200 nmφ) is formed to penetrate through the liner layer 105 and the interlayer insulating layer 106 such that the liner layer 105 is exposed. The contact hole 107 corresponds to a contact hole penetrating through the first interlayer insulating layer.

The second close contact layer 108 is formed to cover inner lateral and bottom surfaces of the contact hole 107 and a part of the upper surface of the interlayer insulating layer 106, and to be contact with the first metal wiring 104. The second close contact layer 108 is made of, e.g., tantalum nitride (having a film thickness of not less than 5 nm and not more than 20 nm). The second close contact layer 108 corresponds to a close contact layer covering the sidewall and the bottom surface of the contact hole and a part of the upper surface of the first interlayer insulating layer. Here, the second close contact layer 108 is a metal layer that makes the contact plug 109 reliably closely contacted with the inner lateral and bottom surfaces of the contact hole 107.

The contact plug 109 is buried and filled inside the second close contact layer 108 within the contact hole 107. The contact plug 109 is made of, e.g., copper or tungsten. The contact plug 109 corresponds to a contact plug that is filled in the contact hole and positioned under an upper surface of the close contact layer.

A resistance change element 113 is formed on the second close contact layer 108 and the contact plug 109.

The resistance change element 113 includes the lower electrode (first electrode) 110, the resistance change layer 111, and the upper electrode (second electrode) 112. The lower electrode 110 corresponds to a lower electrode formed on both the contact plug and the close contact layer that covers a part of the upper surface of the first interlayer insulating layer. The resistance change layer 111 corresponds to a resistance change layer formed on the lower electrode. The upper electrode 112 corresponds to an upper electrode formed on the resistance change layer. Here, a film thickness of the lower electrode 110 is larger in a region above the contact plug 109 than in a region above the second close contact layer 108, and a surface of the lower electrode 110 in contact with the resistance change layer 111 is flat.

The resistance change layer 111 is a layer that is interposed between the lower electrode 110 and the upper electrode 112, and that has a resistance value reversibly changed in accordance with an electric signal applied between the lower electrode 110 and the upper electrode 112. For example, the resistance change layer 111 is a layer that is caused to reversibly transit between a high resistance state and a low resistance state in accordance with, e.g., polarity of an electric signal (e.g., a pulse voltage) applied between the lower electrode 110 and the upper electrode 112. In FIG. 1, the resistance change layer 111 has a two-layer structure made of a first resistance change layer 111a connected to the lower electrode 110, and a second resistance change layer 111b connected to the upper electrode 112.

The first resistance change layer 111a is made of an oxygen-deficient first metal oxide, and the second resistance change layer 111b is made of a second metal oxide having a lower degree of oxygen deficiency than the first metal oxide. Minute local regions where the degree of oxygen deficiency is reversibly changed in accordance with the application of the electric pulse are formed in the second resistance change layer 111b of the resistance change element 113. It is thought that those local regions include filaments (electrically conductive paths) constituted by oxygen defect sites.

A resistance change phenomenon in the resistance change layer of the multilayer structure is presumably attributable to that, with the occurrence of oxidation-reduction reactions in the minute local regions formed in the second metal oxide having relatively high resistance, the filaments in the local regions are changed and the resistance value of the resistance change layer 111 is also changed.

In more detail, when a positive voltage is applied to the upper electrode 112, which is connected to the second metal oxide, with the lower electrode 110 being a reference, oxygen ions in the resistance change layer 111 are attracted toward the second metal oxide. This causes an oxidation reaction in the minute local regions formed in the second metal oxide, thus reducing a degree of the oxygen deficiency. As a result, the filaments in the local regions become less apt to couple with each other, and the resistance value of the resistance change layer 111 is increased.

To the contrary, when a negative voltage is applied to the upper electrode 112, which is connected to the second metal oxide, with the lower electrode 110 being a reference, oxygen ions in the second metal oxide are pushed toward the first metal oxide. This causes a reduction reaction in the minute local regions formed in the second metal oxide, thus increasing a degree of the oxygen deficiency. As a result, the filaments in the local regions become more apt to couple with each other, and the resistance value the resistance change layer 111 is reduced.

The lower electrode 110 may be made of the same material as that of the second close contact layer 108. The lower electrode 110 and the second close contact layer 108 may be each a nitride of a transition metal. The nitride of transition metal may be, e.g., tantalum nitride (TaN) or titanium nitride (TiN).

When the lower electrode 110 and the second close contact layer 108 are made of the same material, the resistance change element 113 can be more easily processed in a step of processing the resistance change element 113 by dry etching, as well as processing of the lower electrode 110 and the second close contact layer 108.

An interlayer insulating layer 114 (third interlayer insulating layer) is formed on the interlayer insulating layer 106 and the resistance change element 113. In the interlayer insulating layer 114, a second wiring groove 115 is formed above the upper electrode 112. A third close contact layer 116 is formed on lateral and bottom surfaces of the second wiring groove 115. Here, the third close contact layer 116 is a metal layer that makes a second metal wiring 117 reliably closely contacted with inner lateral and bottom surfaces of the second wiring groove 115. The second metal wiring 117 is formed on the third close contact layer 116. The upper electrode 112 constituting the resistance change element 113 is electrically connected to the second metal wiring 117 through the third close contact layer 116. The third close contact layer 116 has, for example, a multilayer structure made of films of tantalum and a tantalum nitride (each having a film thickness of not less than 5 nm and not more than 20 nm). The second metal wiring 117 is made of a copper wire. The second metal wiring 117 may be made of a metal (e.g., aluminum) other than copper. While the second metal wiring 117 is illustrated in FIG. 1 as extending in the same direction as the first metal wiring 104, the second metal wiring 117 may be formed to extend in a direction perpendicular to the first metal wiring 104.

Because the above-mentioned layers constituting the resistance change element 113 are processed simultaneously by dry etching with a hard mask (not illustrated) disposed on the upper electrode 112, respective lateral surfaces (end surfaces) of those layers are positioned in the same plane and are linearly connected to each other when viewed from a side. In other words, respective lateral surfaces of the close contact layer covering a part of the upper surface of the first interlayer insulating layer, the lower electrode, the resistance change layer, and the upper electrode are present in the same plane.

The terms used here are defined as follows.

The term "degree of oxygen deficiency" implies a rate of oxygen in a metal oxide, which is deficient with respect to an amount of oxygen used to constitute the metal oxide of stoichiometric composition (when there is a plurality of stoichiometric compositions, the stoichiometric composition having a maximum resistance value among them). The metal oxide of the stoichiometric composition is more stable than metal oxides of other compositions and has a higher resistance value than the latter metal oxides.

In the case of the metal being tantalum (Ta), for example, an oxide of the stoichiometric composition according to the above-described definition is $Ta_2O_5$. Thus, it can be expressed by $TaO_{2.5}$. The degree of oxygen deficiency of $TaO_{2.5}$ is 0%, and the degree of oxygen deficiency of $TaO_{1.5}$ is given by (2.5−1.5)/2.5=40%. In an oxygen-excessive metal oxide, the degree of oxygen deficiency takes a negative value. In this specification, the degree of oxygen deficiency is employed as including a positive value, 0, and a negative value unless otherwise specified.

An oxide having a smaller degree of oxygen deficiency exhibits a higher resistance value because it is closer to the oxide of the stoichiometric composition. On the other hand, an oxide having a larger degree of oxygen deficiency exhibits a lower resistance value because it is closer to the metal constituting the oxide.

The term "oxygen content" implies a ratio of oxygen atoms to a total number of atoms. The oxygen content of $Ta_2O_5$, for example, is given by a ratio of oxygen atoms to a total number of atoms, i.e., (O/(Ta+O)), and it is 71.4 atm %. Accordingly, the oxygen content of the oxygen-deficient tantalum oxide is larger than 0 and smaller than 71.4 atm %. For example, when a metal constituting the first metal oxide and a metal constituting the second metal oxide are of the same type, the oxygen content and the degree of oxygen deficiency are in linked relation. Stated in another way, when the oxygen content of the second metal oxide is larger than that of the first metal oxide, the degree of oxygen deficiency in the second metal oxide is smaller than that in the first metal oxide. The resistance change layer 111 may be made of an oxygen-deficient transition metal oxide (e.g., an oxygen-deficient tantalum oxide). The term "oxygen-deficient transition metal oxide" implies an oxide in which, on an assumption that a transition metal is denoted by M, oxygen is denoted by O, and a transition metal oxide is denoted by $MO_x$, a composition x of the oxygen O is smaller (usually in a state of a semiconductor) than that in a stoichiometrically stable state (usually an insulator). When the transition metal being tantalum, for example, $Ta_2O_5$ corresponds to a stoichiometrically stable state. Accordingly, in the case of $0<x<2.5$, the tantalum oxide can be said as being oxygen-deficient.

When the oxygen-deficient transition metal oxide is used as the resistance change layer 111, the resistance change layer 111 is formed by the so-called reactive sputtering method in which sputtering is performed in an atmosphere of argon gas and oxygen gas by employing tantalum as a target. In the reactive sputtering, an oxygen concentration in the resistance change layer 111 is controlled by adjusting a flow rate of oxygen. The oxygen content of the resistance change layer 111 may be controlled to, e.g., 44.4 to 65.5 atm % (i.e., $0.8 \leq x \leq 1.9$ in terms of $TaO_x$).

By employing the resistance change layer 111 made of the above-described oxygen-deficient tantalum oxide, and by applying predetermined electric pulses (e.g., pulse voltages) in different polarities between the upper electrode 112 and the lower electrode 110, the resistive nonvolatile storage device can be realized which utilizes the resistance change phenomenon, which can reversibly change its electrical resistance value, and which has a stable rewrite characteristic. When the tantalum oxide is used as each of the first resistance change layer 111a and the second resistance change layer 111b, the oxygen content of the first resistance change layer 111a may be 44.4 to 65.5 atm % (i.e., $0.8 \leq x \leq 1.9$ when the tantalum oxide is denoted by $TaO_x$), and the oxygen content of the second resistance change layer 111b may satisfy $x<y$ when a tantalum oxide to provide an oxygen content higher than that of the first resistance change layer 111a is denoted by $TaO_y$. By setting the oxygen content of the second resistance change layer 111b connected to the upper electrode 112 to be higher than the oxygen content of the first resistance change layer 111a, resistance change due to oxidation and reduction is more apt to occur near the interface between the second resistance change layer 111b and the upper electrode 112. As a result, the resistance change element 113 is realized which can be driven at a relatively low voltage, and which has stable resistance change characteristics. The resistance change layer 111 is not limited to the two-layer structure illustrated in FIG. 1, and it may have a structure of a single layer or three or more layers.

The metal constituting the resistance change layer 111 may be a metal other than tantalum. A transition metal or aluminum (Al) may be used as the metal constituting the resistance change layer 111. The transition metal may be, for example, tantalum (Ta), titanium (Ti), hafnium (Hf), zirconium (Zr), niobium (Nb), tungsten (W), or nickel (Ni). Because the transition metal can take a plurality of oxidation states, it is possible to realize different resistance states with oxidation-reduction reactions.

As described above, the first resistance change layer 111a is made of the oxygen-deficient first metal oxide, and the second resistance change layer 111b is made of the second metal oxide having a lower degree of oxygen deficiency than that of the first metal oxide.

In the case of employing, for example, a hafnium oxide as the resistance change layer 111, the resistance value of the resistance change layer 111 can be stably changed at a high speed when x is not less than 0.9 and not more than 1.6 on an assumption that the composition of the first metal oxide is expressed by $HfO_x$, and when y has a larger value than x on an assumption that the composition of the second metal oxide is expressed by $HfO_y$. In that case, the second metal oxide may have a film thickness of not less than 3 nm and not more than 4 nm.

When the hafnium oxide is used, the first resistance change layer (first hafnium oxide layer) is formed on the first electrode by the so-called reactive sputtering method in which sputtering is performed in an atmosphere of argon gas and oxygen gas by employing a Hf target. The second resistance change layer (second hafnium oxide layer) can be formed by, after forming the first hafnium oxide layer, exposing a surface of the first hafnium oxide layer to plasma of argon gas and oxygen gas. The oxygen content of the first hafnium oxide layer can be easily adjusted by changing a flow rate ratio of the oxygen gas to the argon gas during the reactive sputtering as in the above-described case of employing the tantalum oxide. Such processing can be performed at a room temperature without particularly heating a substrate. Furthermore, a film thickness of the second hafnium oxide layer can be easily adjusted depending on a time of exposure to the plasma of argon gas and oxygen gas.

In the case of employing a zirconium oxide, the resistance value of the resistance change layer can be stably changed at a high speed when x is not less than 0.9 and not more than 1.4 on an assumption that the composition of the first metal oxide is expressed by $ZrO_x$, and when y has a larger value than x on an assumption that the composition of the second metal oxide is expressed by $ZrO_y$. In that case, the second metal oxide may have a film thickness of not less than 1 nm and not more than 5 nm. When the zirconium oxide is used, a first zirconium oxide layer is formed on the underlying first electrode by the so-called reactive sputtering method in which sputtering is performed in an atmosphere of argon gas and oxygen gas by employing Zr as a target. A second zirconium oxide layer can be formed by, after forming the first zirconium oxide layer, exposing a surface of the first zirconium oxide layer to plasma of argon gas and oxygen gas. The oxygen content of the first zirconium oxide layer can be easily adjusted by changing a flow rate ratio of the oxygen gas to the argon gas during the reactive sputtering as in the above-described case of employing the tantalum oxide. Such processing can be performed at a room temperature without particularly heating a substrate. Furthermore, a film thickness of the second zirconium oxide layer can be easily adjusted depending on a time of exposure to the plasma of argon gas and oxygen gas.

Different metals may be used as the first metal constituting the first metal oxide and the second metal constituting the second metal oxide. In such a case, the second metal oxide may have a lower degree of oxygen deficiency, i.e., higher resistance, than the first metal oxide. With such a feature, the voltage applied between the first electrode and the second electrode during the resistance change is distributed to the second metal oxide at a greater proportion, thus enabling the oxidation-reduction reactions to be more easily caused in the second metal oxide.

When different materials are used as the first metal constituting the first metal oxide serving as the first resistance change layer and the second metal constituting the second metal oxide serving as the second resistance change layer, the standard electrode potential of the second metal may be lower than that of the first metal. The standard electrode potential has such a characteristic that oxidation is less apt to occur at a higher value of the standard electrode potential. Thus, the oxidation-reduction reactions are more apt to occur in the second metal oxide that has a relatively low standard electrode potential. The resistance change phenomenon is presumably attributable to that, with the occurrence of oxidation-reduction reactions in the minute local regions formed in the second metal oxide having relatively high resistance, the filaments (electrically conductive paths) in the local regions are changed and the resistance value (degree of oxygen deficiency) of the second metal oxide is also changed.

A stable resistance change operation can be obtained, for example, by employing an oxygen-deficient tantalum oxide ($TaO_x$) as the first metal oxide and a titanium oxide ($TiO_2$) as the second metal oxide. Titanium (standard electrode potential=−1.63 eV) is a material having a standard electrode potential lower than that of tantalum (standard electrode potential=−0.6 eV). Thus, the oxidation-reduction reactions are more apt to occur in the second metal oxide by employing, as the second metal oxide, a metal oxide having a standard electrode potential lower than that of the first metal oxide. As another combination, an aluminum oxide ($Al_2O_3$) can be used as the second metal oxide that serves as a high resistance layer. For example, the oxygen-deficient tantalum oxide ($TaO_x$) may be used as the first metal oxide, and the aluminum oxide ($Al_2O_3$) may be used as the second metal oxide. The upper electrode 112 connected to the second metal oxide having a lower degree of oxygen deficiency is made of, e.g., platinum (Pt), iridium (Ir), or palladium (Pd). The standard electrode potential of a metal constituting the upper electrode 112 may be higher than that of a metal constituting the second metal oxide and that of a material constituting the lower electrode 110. The lower electrode 110 is connected to the first metal oxide having a higher degree of oxygen deficiency. The standard electrode potential of a material constituting the lower electrode 110 may be lower than that of a metal constituting the first metal oxide. The lower electrode 110 may be made of, e.g., tungsten (W), nickel (Ni), tantalum (Ta), titanium (Ti), aluminum (Al), tantalum nitride (TaN), or titanium nitride (TiN). The standard electrode potential has such a characteristic that oxidation is less apt to occur at a higher value of the standard electrode potential.

Thus, given that the standard electrode potential of the upper electrode 112 is V2, the standard electrode potential of the metal constituting the second metal oxide is Vr2, the standard electrode potential of the metal constituting the first metal oxide is Vr1, and the standard electrode potential of the lower electrode 110 is V1, those parameters may satisfy relations of Vr2<V2 and V1<V2. Moreover, those parameters may satisfy relation of V2>Vr2 and Vr1≥V1.

As a difference in the standard electrode potential between the electrode and the metal constituting the resistance change layer increases, the oxidation reaction is more apt to occur in the resistance change layer, and therefore the resistance change is also more apt to occur in the resistance change layer. Conversely, as that difference decreases, the resistance change is less apt to occur due to the occurrence of the oxidation reaction in the electrode. It is hence presumed that easiness in oxidation of the resistance change layer at the interface between the electrode and the resistance change layer takes a great role in mechanism causing the resistance change phenomenon. The standard electrode potentials of iridium and platinum are about 1.2 eV. The standard electrode potential of tantalum is about −0.6 eV and is lower than those of iridium and platinum. Accordingly, when the upper electrode 112 is made of iridium or platinum and the resistance change layer 111 is made of the oxygen-deficient tantalum oxide, oxidation and reduction reactions of the oxygen-deficient tantalum oxide occur at the interface between the upper electrode 112 made of iridium or platinum and the resistance change layer 111 (specifically, the second resistance change layer 111*b*). As a result, oxygen is transferred within the resistance change layer 111 and between the resistance change layer 111 and the upper electrode 112, whereby the resistance change phenomenon is developed. Materials having higher standard electrode potentials than tantalum are, for example, iridium, platinum, palladium, copper, and tungsten.

With the features described above, the oxidation and reduction reactions are selectively generated in the second metal oxide near the interface between the upper electrode and the second metal oxide, and the resistance change phenomenon is obtained in a stable state.

[Manufacturing Method]

FIGS. 2 to 15 are each a sectional view to explain a step in one example of a manufacturing method for the resistive nonvolatile storage device 10 according to the first embodiment. The manufacturing method for the resistive nonvolatile storage device 10 according to the first embodiment will be described below with reference to FIGS. 2 to 15. In other words, the manufacturing method for the resistive nonvolatile storage device including the resistance change element, which is constituted by the upper electrode, the resistance change layer, and the lower electrode, will be described below.

Figure 2:
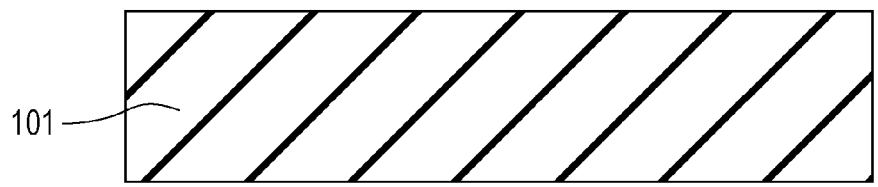
FIG. 2 is a sectional view to explain a step in one example of a manufacturing method for the resistive nonvolatile storage device according to a first embodiment.

First, as illustrated in FIG. 2, the interlayer insulating layer 101 (second interlayer insulating layer) made of a silicon oxide is formed by plasma CVD, for example, on a semiconductor substrate (not illustrated) on which transistors, etc. are formed in advance. A step of forming the second interlayer insulating layer on the substrate is thus carried out.

Figure 3:
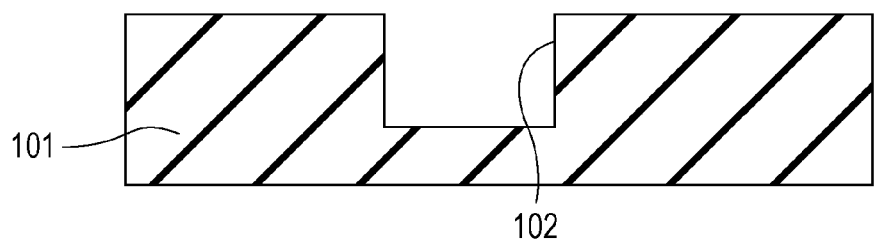
FIG. 3 is a sectional view to explain a step in the one example of the manufacturing method for the resistive nonvolatile storage device according to the first embodiment.

Then, as illustrated in FIG. 3, the first wiring groove 102 in which the first metal wiring 104 is to be buried is formed in the interlayer insulating layer 101 by photolithography and dry etching.

Figure 4:
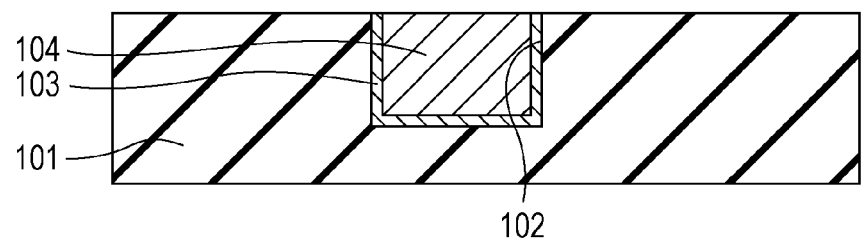
FIG. 4 is a sectional view to explain a step in the one example of the manufacturing method for the resistive nonvolatile storage device according to the first embodiment.

Then, as illustrated in FIG. 4, a first barrier metal layer (having a multilayer structure of, e.g., a tantalum oxide (film thickness of not less than 5 nm and not more than 40 nm) and tantalum (film thickness of not less than 5 nm and not more than 40 nm), which becomes the first close contact layer 103, and copper forming a seed layer of a wiring material (film thickness of not less than 50 nm and not more than 300 nm) are deposited in the first wiring groove 102 by sputtering, for example. Subsequently, copper is further deposited on the copper seed layer by electrolytic plating, for example, such that the wiring material, i.e., copper, fully fills the first wiring groove 102 on which lateral and bottom surfaces the first close contact layer 103 is formed. Thereafter, extra copper in a surface portion of the deposited copper is removed by CMP (Chemical Mechanical Polishing), and an upper surface of the interlayer insulating layer 101 and an upper surface of the first metal wiring 104 are made flush with each other. The first metal wiring 104 is formed by the above-described manufacturing method. A step of forming the first wiring, which is positioned in the second interlayer insulating layer in a state having an exposed surface, is thus carried out. Here, the step of forming the first wiring includes a step of forming the first wiring groove in the second interlayer insulating layer, and a step of burying the first wiring material in the first wiring groove.

Figure 5:
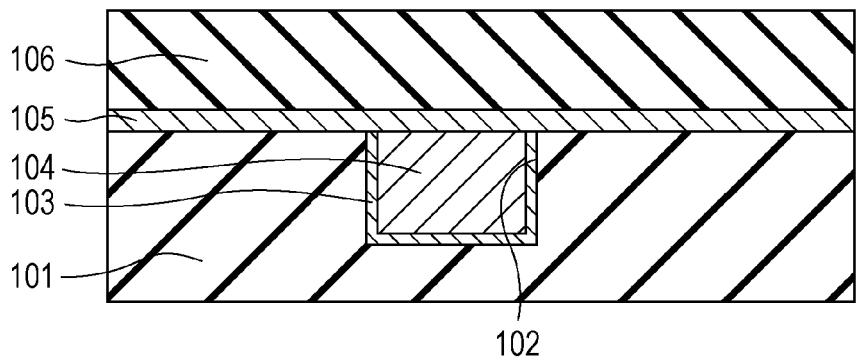
FIG. 5 is a sectional view to explain a step in the one example of the manufacturing method for the resistive nonvolatile storage device according to the first embodiment.

Then, as illustrated in FIG. 5, a silicon nitride (insulating layer) is deposited (in film thickness of not less than 20 nm and not more than 100 nm) on the upper surface of the interlayer insulating layer 101 and an upper surface of the first metal wiring 104 by plasma CVD, for example. The liner layer 105 covering the interlayer insulating layer 101 and the first metal wiring 104 is thereby formed. Subsequently, the interlayer insulating layer 106 (first interlayer insulating layer) made of an silicon oxide is further deposited on the liner layer 105 by plasma CVD, for example. If necessary, a level difference in an upper surface of the interlayer insulating layer 106 is reduced by CMP. A step of forming the first interlayer insulating layer above the substrate is thus carried out.

Figure 6:
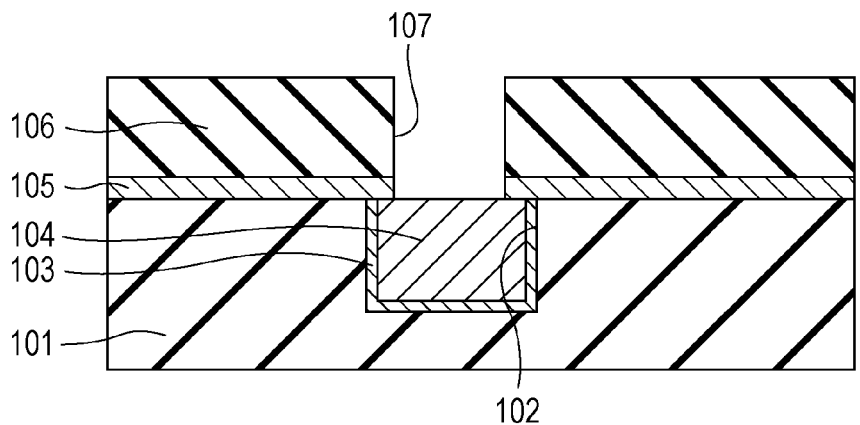
FIG. 6 is a sectional view to explain a step in the one example of the manufacturing method for the resistive nonvolatile storage device according to the first embodiment.

Then, as illustrated in FIG. 6, the contact hole 107 in which a plug connected to the first metal wiring 104 is to be buried is formed at a predetermined position on the first metal wiring 104 by photolithography and dry etching. A step of opening a contact hole through the first interlayer insulating layer is thus carried out.

Figure 7:
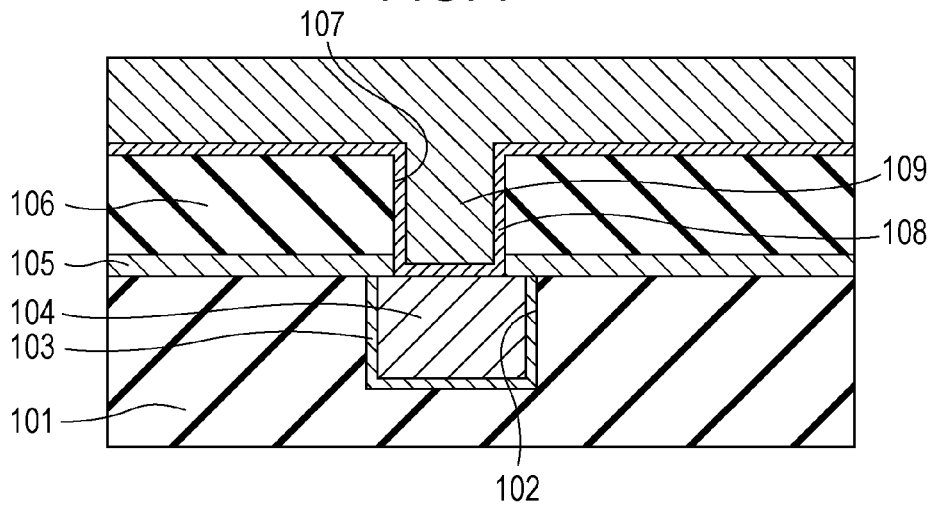
FIG. 7 is a sectional view to explain a step in the one example of the manufacturing method for the resistive nonvolatile storage device according to the first embodiment.

Then, as illustrated in FIG. 7, the second close contact layer 108 having a multilayer structure of a tantalum nitride (film thickness of not less than 5 nm and not more than 40 nm) and tantalum (film thickness of not less than 5 nm and not more than 40 nm), and copper (Cu) 109 as a wiring material forming a second conductive layer (film thickness of not less than 50 nm and not more than 300 nm) are deposited on the interlayer insulating layer 106, as well as on inner surfaces of the contact hole 107 formed as described above, by sputtering, for example. Subsequently, copper is further deposited by electrolytic plating, for example, with the previously deposited copper used as a seed, whereby copper is deposited inside the contact hole 107 and on the second close contact layer 108. A step of forming the close contact layer that covers a sidewall and a bottom surface of the contact hole and an upper surface of the first interlayer insulating layer, and a step of depositing a conductive layer on the close contact layer, which covers the sidewall and the bottom surface of the contact hole and the upper surface of the first interlayer insulating layer, are thus carried out. In the step of forming the close contact layer, the close contact layer is formed such that the first wiring (first metal wiring 104) is contacted with a bottom surface of the close contact layer.

Figure 8:
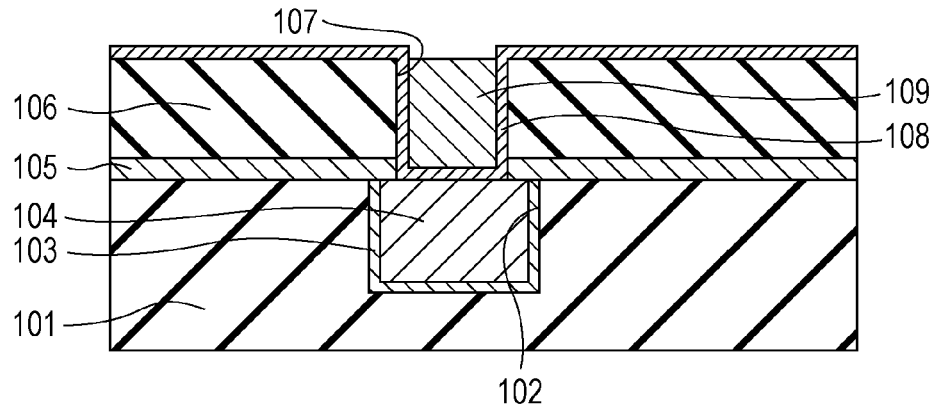
FIG. 8 is a sectional view to explain a step in the one example of the manufacturing method for the resistive nonvolatile storage device according to the first embodiment.

Then, as illustrated in FIG. 8, the contact plug 109 is formed by removing only extra copper present on an upper surface of the second close contact layer 108 by CMP using slurry, which exhibits a lower polishing rate for the tantalum nitride than that for the copper film, i.e., which has high selectivity for the tantalum nitride. In other words, the CMP is performed in a way of maintaining a state where the second close contact layer 108 covers the interlayer insulating layer 106. Namely, during the CMP, the respective upper surfaces of the interlayer insulating layer 106 and the first metal wiring 104 are held in a state entirely covered with the second close contact layer 108 and the contact plug 109. A step of polishing the conductive layer to expose an upper surface of the close contact layer, which is formed on the first interlayer insulating layer, and to make an upper surface of the conductive layer exposed inside the contact hole is thus carried out.

The above step provides a state where the upper surface of the interlayer insulating layer 106 is not exposed, and where an entire upper surface is covered with metal films (i.e., the second close contact layer 108 and the contact plug 109) regardless of an opening ratio (pattern density) of the contact plug 109. Accordingly, there is no region in which the pattern density of the contact plug is abruptly changed like the end portion of the memory array region mentioned above. It is hence possible, in principle, to suppress the above-described global level difference.

Next, as illustrated in FIGS. 9 to 12, the resistance change element 113 is formed on the respective upper surfaces of the second close contact layer 108 and the contact plug 109.

Figure 9:
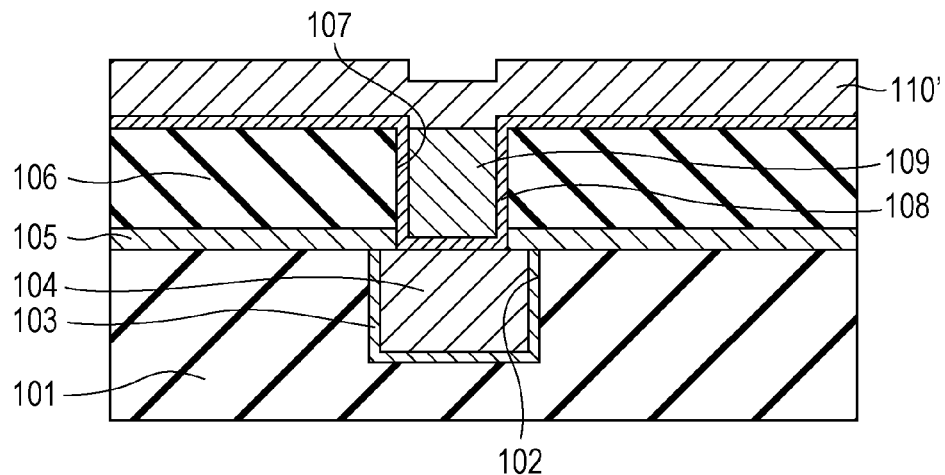
FIG. 9 is a sectional view to explain a step in the one example of the manufacturing method for the resistive nonvolatile storage device according to the first embodiment.

First, as illustrated in FIG. 9, a lower electrode layer 110' (film thickness of not less than 10 nm and not more than 30 nm) made of a tantalum nitride is deposited on both the contact plug 109 and the second close contact layer 108 by sputtering, for example. A step of forming the lower electrode layer on both the exposed close contact layer and the contact plug, which is formed of the conductive layer in the contact hole, is thus carried out.

Figure 10:
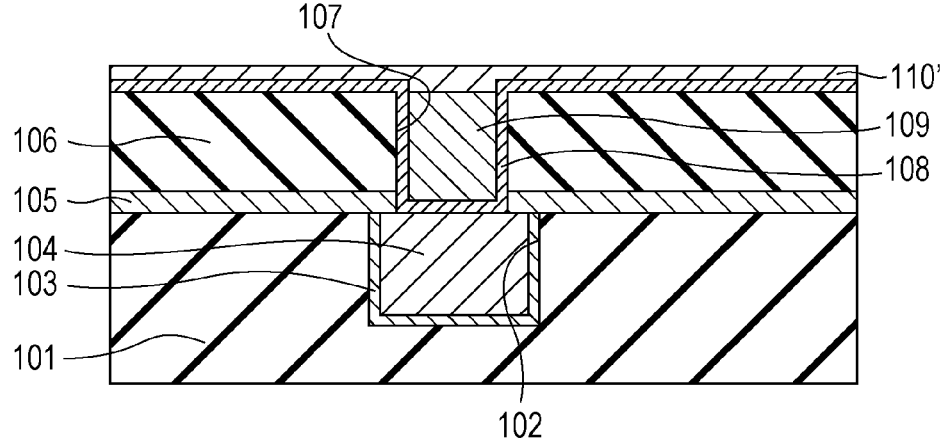
FIG. 10 is a sectional view to explain a step in the one example of the manufacturing method for the resistive nonvolatile storage device according to the first embodiment.

After depositing the tantalum nitride and forming the lower electrode layer 110', CMP is carried out to planarize an upper surface of the deposited tantalum nitride, as illustrated in FIG. 10. This is intended to remove a recess (concave portion) formed above the contact plug 109 having the recessed upper surface that has been generated by the CMP of the copper film. A step of, after forming the lower electrode layer, polishing an upper surface of the lower electrode layer to set a film thickness of the lower electrode layer to be larger in a region above the contact plug than in a region above the close contact layer, and to planarize a surface of the lower electrode layer, which surface is in contact with the resistance change layer, is thus carried out.

The lower electrode layer 110' may be formed in a two-layer structure to remove the recess (concave portion) formed above the contact plug 109 having the recessed upper surface that has been generated by the CMP of the copper film. More specifically, the recess formed above the contact plug 109 may be removed by depositing a first lower electrode layer 110a' (not illustrated), and then polishing an upper surface of the first lower electrode layer 110a' by CMP to planarize the upper surface of the first lower electrode layer 110a'. With that processing, the operation of the resistance change element can be stabilized. Thereafter, a second lower electrode layer 110b' (not illustrated) may be deposited on the first lower electrode layer 110a', of which upper surface has been planarized, by sputtering, for example. This eliminates the necessity of polishing an upper surface of the second lower electrode layer by CMP. It is hence possible to avoid the upper surface of the second lower electrode layer from being oxidized by the influence of slurry used in the CMP, and to control an oxygen concentration at the interface between a second lower electrode, which is formed by the second lower electrode layer, and the resistance change layer 111 to be formed thereon later.

As described above, a step of forming the lower electrode layer may include a step of depositing the first lower electrode layer on both the close contact layer and the conductive layer, a step of polishing the surface of the first lower electrode layer to planarize the relevant surface, and a step of depositing the second lower electrode layer on the planarized first lower electrode layer.

Figure 11:
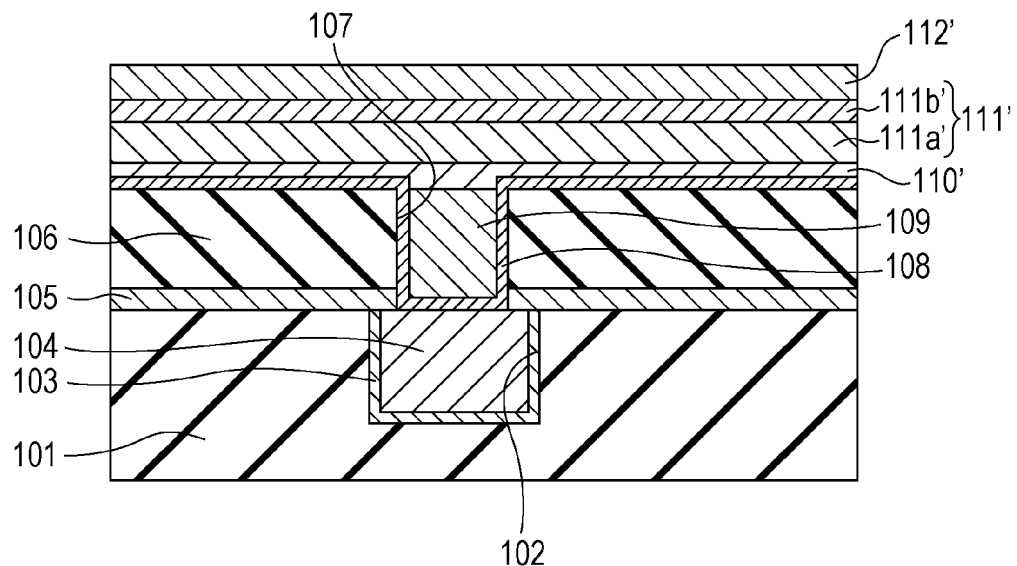
FIG. 11 is a sectional view to explain a step in the one example of the manufacturing method for the resistive nonvolatile storage device according to the first embodiment.

Then, as illustrated in FIG. 11, a resistance change thin film 111' is deposited by the so-called reactive sputtering method in which sputtering is performed in an atmosphere of argon gas and oxygen gas by employing tantalum as a target. A step of forming the resistance change thin film on the planarized lower electrode layer is thus carried out. Here, an oxygen concentration in a layer forming the resistance change thin film is controlled to 45 to 65 atm % by adjusting a flow rate of oxygen. As a result, a specific resistance of an oxygen-deficient first resistance change thin film 111a' can be controlled to 0.5 to 20 mΩ·cm. By setting the oxygen concentration to 60 atm %, for example, the first resistance change thin film 111a' having the specific resistance of about 2 mΩ·cm can be formed. In addition, a second resistance change thin film 111b' (e.g., a $Ta_2O_5$ layer) having a higher oxygen content than the first resistance change thin film 111a' may be formed in a film thickness of not less than 2 nm and not more than 12 nm by oxidizing a surface of the first resistance change thin film 111a'. Stated in another way, a step of forming the resistance change layer may include a step of forming a first metal oxide layer made of an oxygen-deficient metal oxide, and a step of forming a second metal oxide layer having a lower degree of oxygen deficiency than the first metal oxide layer.

While the resistance change thin film 111' has been described above, by way of example, as having the two-layer structure, it may have a single-layer structure. Alternatively, the resistance change thin film 111' may be formed in a structure of three or more layers by adjusting the flow rate of oxygen as appropriate.

Next, an upper electrode layer 112' (film thickness of not less than 20 nm and not more than 50 nm) made of, e.g., iridium is deposited on the resistance change thin film 111' by sputtering, for example. A step of forming the upper electrode layer on the resistance change thin film is thus carried out. The upper electrode 112' may be deposited by employing another noble metal, e.g., platinum or palladium, other than iridium. Moreover, on the upper electrode layer 112' containing the noble metal, any of a tantalum nitride, a titanium nitride, and a titanium-aluminum nitride may be deposited (though not illustrated) to stack a horizontally-extending conductive film that is to be used as a hard mask during dry etching. The conductive hard mask is formed by sputtering, for example.

Figure 12:
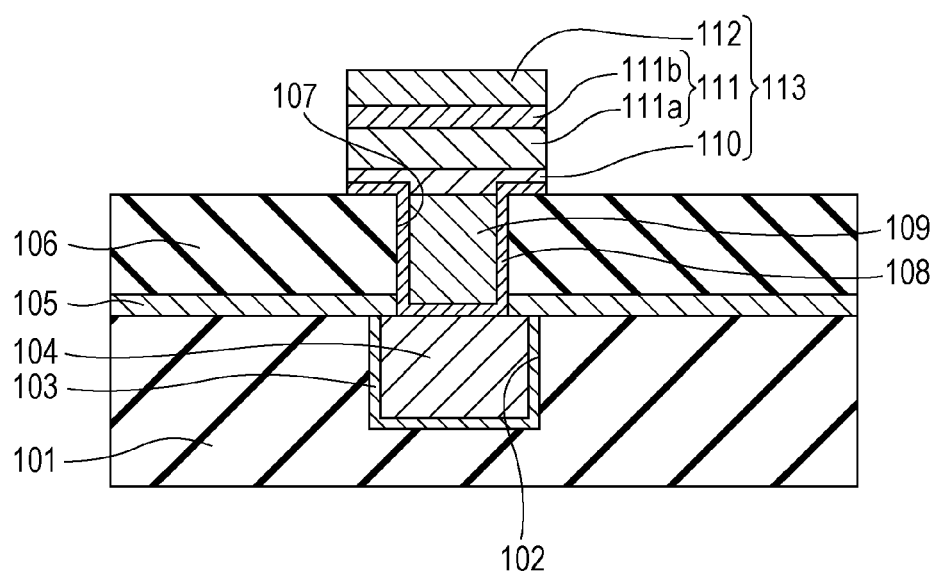
FIG. 12 is a sectional view to explain a step in the one example of the manufacturing method for the resistive nonvolatile storage device according to the first embodiment.

Then, as illustrated in FIG. 12, the upper electrode layer 112', the resistance change thin film 111', the lower electrode layer 110', and the second close contact layer 108, the former threes having been formed in the step illustrated in FIG. 11, are processed (for patterning) by photolithography and dry etching. As a result, the resistance change element 113 is formed which is connected to the contact plug 109, and which has an independent dot-like shape (e.g., a square shape having sides each being of not less than 40 nm and not more than 400 nm, for example, 120 nm, when viewed from above). On that occasion, by simultaneously dry-etching the upper electrode layer 112', the resistance change thin film 111', the lower electrode layer 110', and the second close contact layer 108, lateral surfaces of the resistive nonvolatile storage device can be directly formed at a time, and deposition of a protective layer (not illustrated) on the lateral surfaces is facilitated. A step of forming the resistance change layer by simultaneously processing the upper electrode layer, the resistance change thin film, the lower electrode layer, and the close contact layer into a state where respective lateral surfaces of the upper electrode layer, the resistance change thin film, the lower electrode layer, and the close contact layer are present in the same plane is thus carried out. In that step, the upper electrode layer, the resistance change thin film, the lower electrode layer, and the close contact layer are simultaneously etched into a state of the close contact layer covering just a part of the upper surface of the first interlayer insulating layer.

Figure 13:
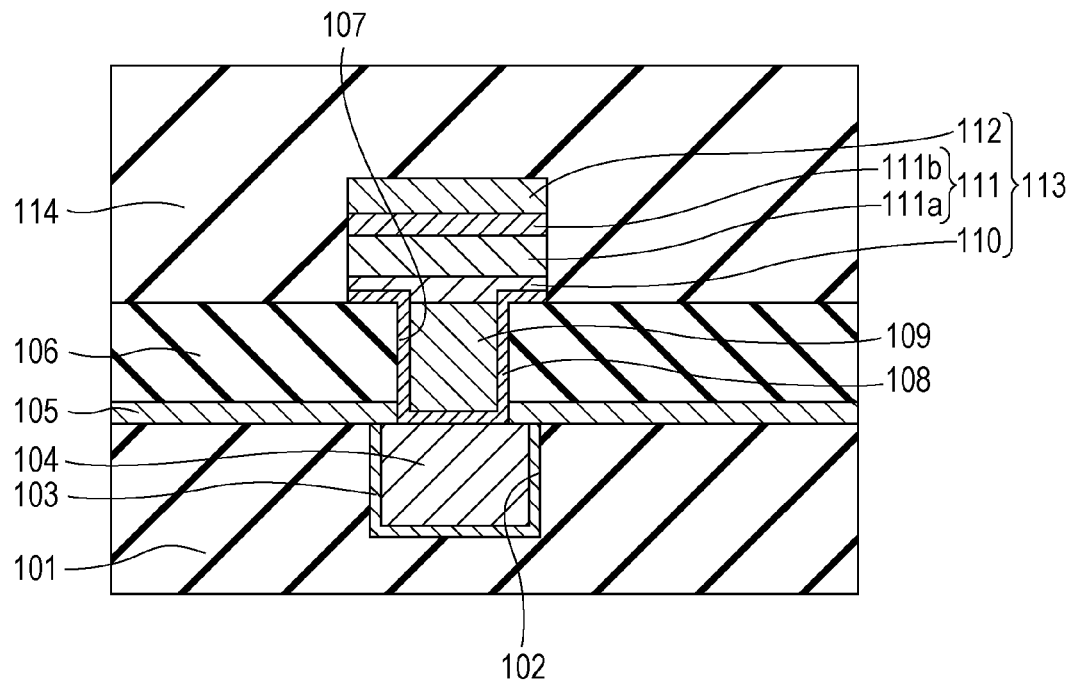
FIG. 13 is a sectional view to explain a step in the one example of the manufacturing method for the resistive nonvolatile storage device according to the first embodiment.

Then, as illustrated in FIG. 13, an interlayer insulating layer 114 made of, e.g., a silicon oxide is deposited on the resistance change element 113 and the interlayer insulating layer 106 by plasma CVD, for example.

Figure 14:
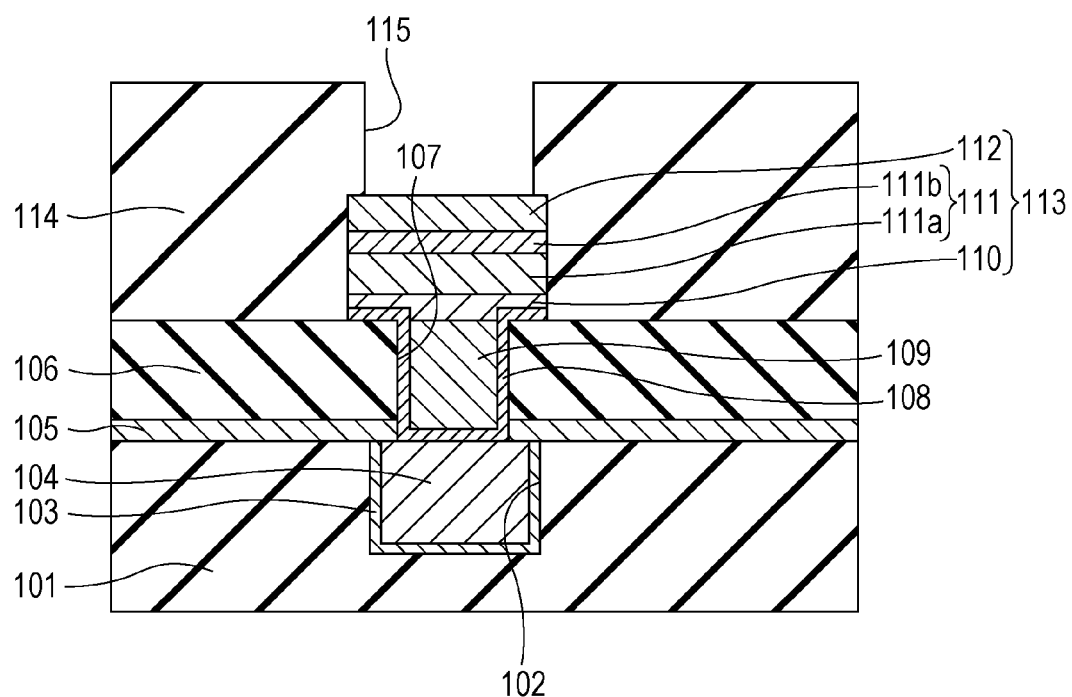
FIG. 14 is a sectional view to explain a step in the one example of the manufacturing method for the resistive nonvolatile storage device according to the first embodiment.

Then, as illustrated in FIG. 14, the second wiring groove 115 is formed in the interlayer insulating layer 114 by photolithography and dry etching. The second wiring groove 115 is formed such that the upper electrode 112 is exposed. Though not illustrated in FIG. 14, a contact hole for connection to the first metal wiring 104 is opened by the dual damascene process at the same time as forming the second wiring groove 115.

Figure 15:
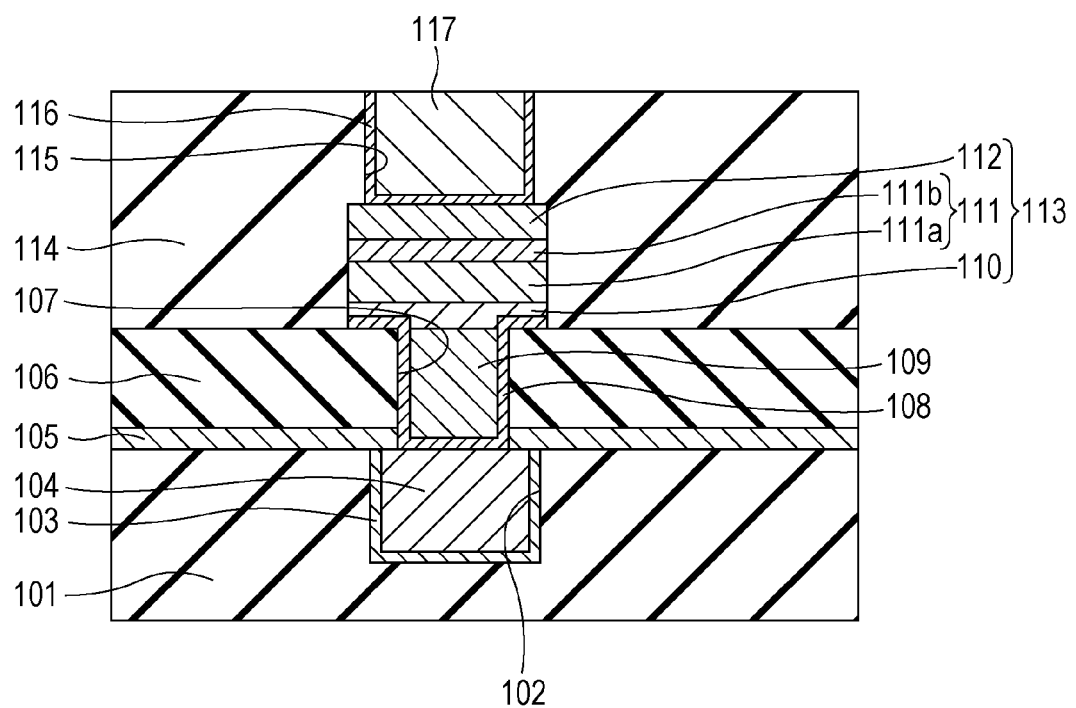
FIG. 15 is a sectional view to explain a step in the one example of the manufacturing method for the resistive nonvolatile storage device according to the first embodiment.

Then, as illustrated in FIG. 15, the third close contact layer 116 and copper serving as a seed layer are deposited in the second wiring groove 115 by sputtering, for example, under the same conditions as those in the above-described step of burying the first metal wiring 104 in the first wiring groove 102. The third close contact layer 116 may have a multilayer structure of, e.g., a tantalum nitride (having a film thickness of not less than 5 nm and not more than 40 nm) and tantalum (having a film thickness of not less than 5 nm and not more than 40 nm). The copper serving as the seed layer may have a film thickness of not less than 50 nm and not more than 300 nm. Subsequently, copper is further deposited by electrolytic plating, for example, using the copper of the copper seed layer as a seed such that a wiring material, i.e., copper, fully fills the second wiring groove 115 on which lateral and bottom surfaces the third close contact layer 116 is formed. Thereafter, extra copper and the third close contact layer 116 on an upper surface of the interlayer insulating layer 114 are removed by CMP, and the upper surface of the interlayer insulating layer 114 and an upper surface of the second metal wiring 117 are made flush with each other. As a result, the second metal wiring 117 is formed. A step of forming the second wiring connected to the upper electrode is thus carried out. Here, the step of forming the second wiring includes a step of forming the third interlayer insulating layer on the lateral and upper surfaces of the resistance change element, which is constituted by the upper electrode, the resistance change layer, and the lower electrode, and on the first interlayer insulating layer, a step of forming the second wiring groove in the third interlayer insulating layer, and a step of burying the second wiring material in the second wiring groove.

Figure 24:
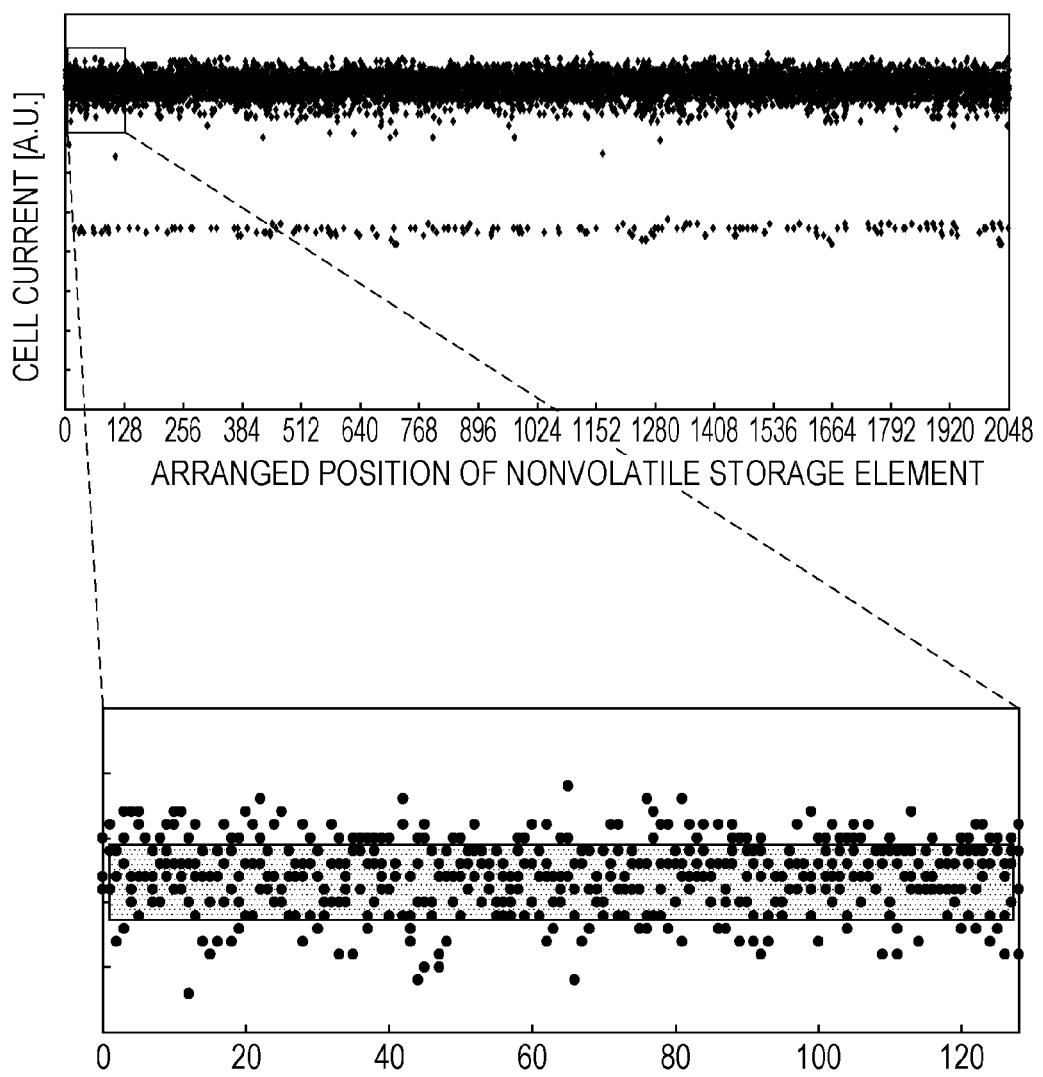
FIG. 24 is a characteristic graph representing dependency of failed bits upon arrangement when the resistive nonvolatile storage devices according to the embodiment are arranged in the form of a memory array.

FIG. 24 is a characteristic graph representing the effect of suppressing characteristic variations in a memory array using the resistive nonvolatile storage devices 10 according to the embodiment, which are manufactured by the above-described manufacturing method. When the resistive nonvolatile storage devices of related art are arranged in the form of a memory array, variations of a cell current appear in the end portion of the memory array region, and the cell current is increased (see FIG. 23). This causes an operation failure. The reason is that, in the resistive nonvolatile storage device of related art, when the second close contact layer 108 on the interlayer insulating layer 106 is removed by CMP in the step of forming the contact plug 109 by the CMP, the surface of the interlayer insulating layer 106 is also polished, and the above-described global level difference (i.e., unevenness in the surface of the interlayer insulating layer attributable to the pattern density of the contact plugs) is caused.

In contrast, in the resistive nonvolatile storage device 10 according to this embodiment, after forming the second close contact layer 108 on the interlayer insulating layer 106, the lower electrode layer 110' is deposited on both the second close contact layer 108 and the contact plug 109 in a state where the second close contact layer 108 is left as it is (FIG. 9), and the upper surface of the lower electrode layer 110' is then planarized by CMP (FIG. 10). Accordingly, it is possible in principle to suppress the above-described global level difference that has been generated in the resistive nonvolatile storage device of the related art in the step of forming the contact plugs by CMP, and to reduce characteristic variations of the resistive nonvolatile storage devices in the memory array region. Hence the number of failed bits in the resistance change operation can be reduced to a large extent, and stability of the manufacturing process can be improved.

The upper electrode 112 may be made of any metal selected from platinum, copper, tungsten, iridium, and palladium, or a combination or an alloy of two or more of those metals. Using such an alloy to constitute the electrode on the side connected to the second resistance change layer 111b of the resistance change layer 111 is effective in suppressing reduction and variations of an initial resistance value, and holding an initial breakdown voltage low.

Figure 16A:
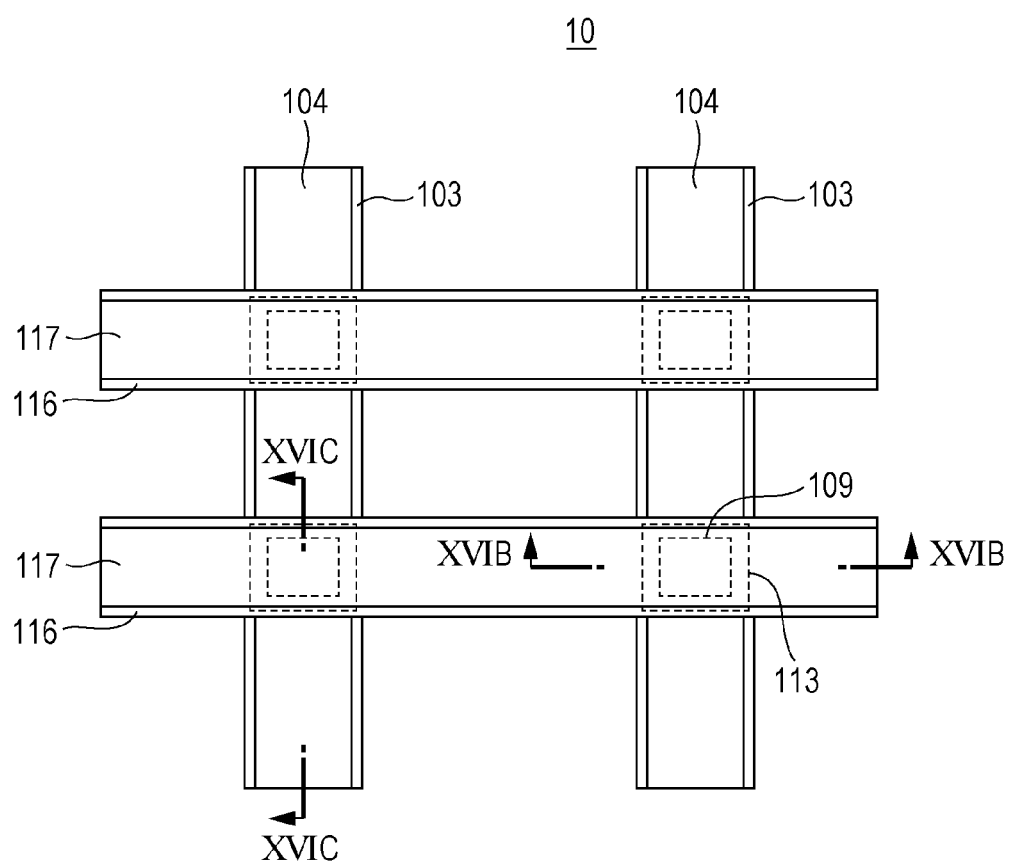
FIG. 16A is a plan view of resistive nonvolatile storage devices according to a modification of the first embodiment.
Figure 16B:
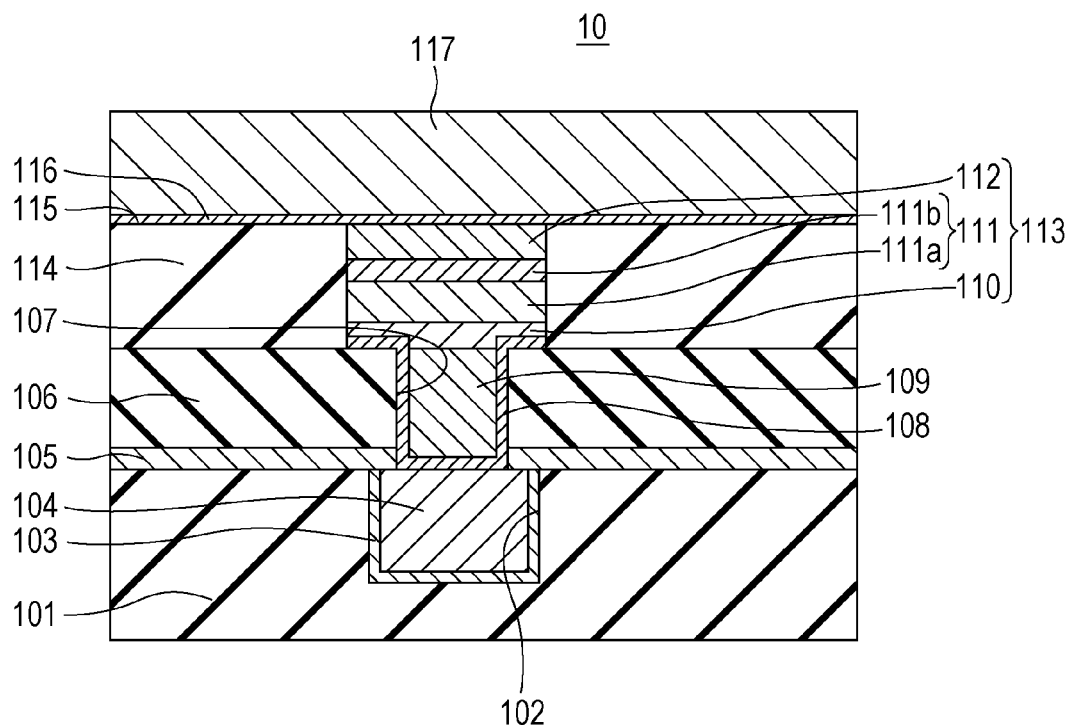
FIG. 16B is a sectional view taken along a section line XVIB-XVIB in FIG. 16A.
Figure 16C:
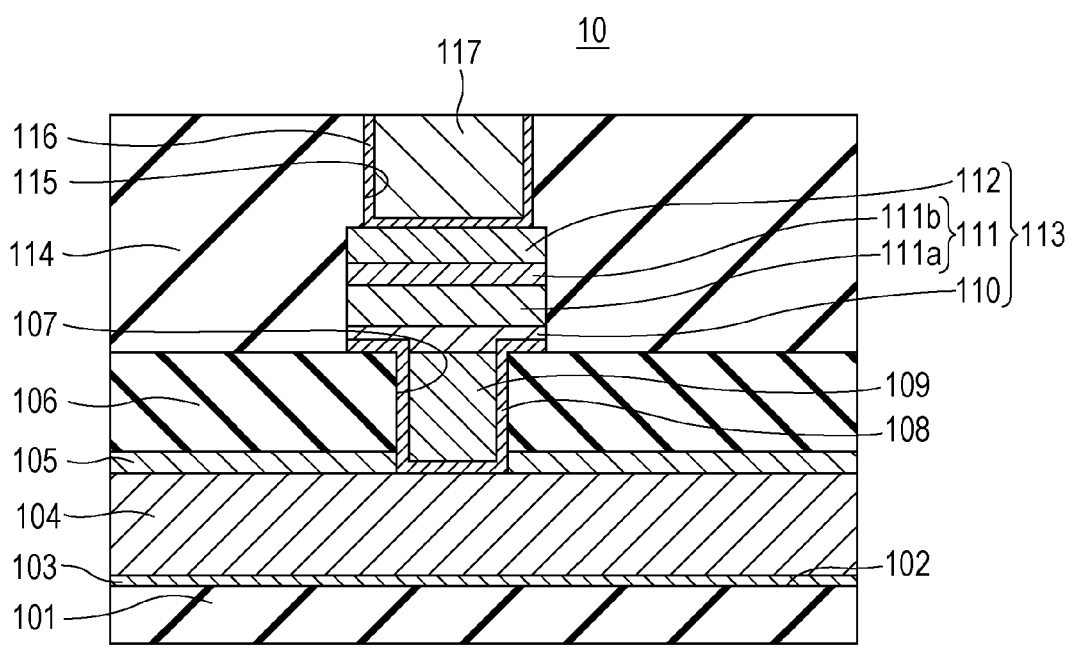
FIG. 16C is a sectional view taken along a section line XVIC-XVIC in FIG. 16A.

While, in the first embodiment, the first metal wiring 104 and the second metal wiring 117 are arranged to extend parallel as illustrated in FIG. 1, the arrangement of the metal wirings is not limited to the illustrated one. Those metal wirings may extend perpendicularly to each other. FIG. 16A is a plan view of resistive nonvolatile storage devices 10 according to a modification of the first embodiment in which the first metal wiring 104 and the second metal wiring 117 extend perpendicularly to each other. In other words, FIG. 16A is a plan view of four resistive nonvolatile storage devices 10 arranged in a specific array. FIG. 16B is a sectional view of the resistive nonvolatile storage device taken along a section line XVIB-XVIB in FIG. 16A when viewed in a direction denoted by an illustrated arrow. FIG. 16C is a sectional view of the resistive nonvolatile storage device taken along a section line XVIC-XVIC in FIG. 16A when viewed in a direction denoted by an illustrated arrow.

In this modification, as illustrated in FIG. 16A, two second metal wirings 117 extending parallel to each other are formed above two first metal wirings 104 extending parallel to each other.

As illustrated in FIG. 16B, in a cross-section taken along the section line XVIB-XVIB in FIG. 16A, the second metal wiring 117 extends perpendicularly to the first metal wiring 104 unlike the sectional structure illustrated in FIG. 1.

As illustrated in FIG. 16C, in a cross-section taken along the section line XVIC-XVIC in FIG. 16A, the first metal wiring 104 extends perpendicularly to the second metal wiring 117 unlike the sectional structure illustrated in FIG. 1.

Even the resistive nonvolatile storage device 10 according to the modification, illustrated in FIGS. 16A to 16C, is also manufactured by a manufacturing method similar to that used in the above first embodiment except for directions in which the first metal wiring 104 and the second metal wiring 117 are arranged. Thus, in the resistive nonvolatile storage device 10 according to this modification, after forming the second close contact layer 108 on the interlayer insulating layer 106, the lower electrode layer 110' is deposited on both the second close contact layer 108 and the contact plug 109 in a state where the second close contact layer 108 is left as it is (FIG. 9), and then planarizing the upper surface of the lower electrode layer 110' by CMP (FIG. 10). Accordingly, it is possible in principle to suppress the above-described global level difference that has been generated in the resistive nonvolatile storage device of the related art in the step of forming the contact plugs by CMP, and to reduce characteristic variations of the resistive nonvolatile storage devices in the memory array region. Hence the number of failed bits in the resistance change operation can be reduced to a large extent, and stability of the manufacturing process can be improved.

Second Embodiment

A resistive nonvolatile storage apparatus will be described in which the resistive nonvolatile storage devices 10 according to the first embodiment are employed and one diode serving as a current control element is electrically connected to each of the resistive nonvolatile storage devices.

The resistive nonvolatile storage apparatus according to a second aspect includes: a semiconductor substrate; a plurality of first wirings and a plurality of second wirings, which are disposed on the semiconductor substrate and are disposed in mutually crossing relation; a plurality of resistive nonvolatile storage devices disposed respectively in areas that the plurality of first wirings and the plurality of second wirings form in a top view; and a plurality of current control devices disposed respectively in areas that the plurality of first wirings and the plurality of second wirings form in a top view, each of the plurality of current control devices controlling current corresponding to each of the plurality of resistive nonvolatile storage devices. The above-described resistive nonvolatile storage device 10 according to the first embodiment is used as each of the plurality of resistive nonvolatile storage devices. In this embodiment, a diode is used as the current control element.

With the features described above, in the case of the resistive nonvolatile storage devices being arranged in the form of a memory array, even when polishing (e.g., CMP) of a conductive layer, which constitutes a plug material, is performed in a step of forming the contact plugs, the conductive layer is polished in a state where the close contact layer covering a part of the upper surface of the interlayer insulating layer remains, on which part the contact plug is formed. Accordingly, the interlayer insulating layer is not polished, and surface unevenness (so-called global level difference), including the level difference in the end portion of the memory array region and the recess in the surface of the interlayer insulating layer, can be suppressed. As a result, variations in characteristics of a large-capacity resistive nonvolatile storage apparatus of cross-point type, which employs many resistive nonvolatile storage devices, can be reduced.

[Configuration of Resistive Nonvolatile Storage Apparatus]

Figure 17:
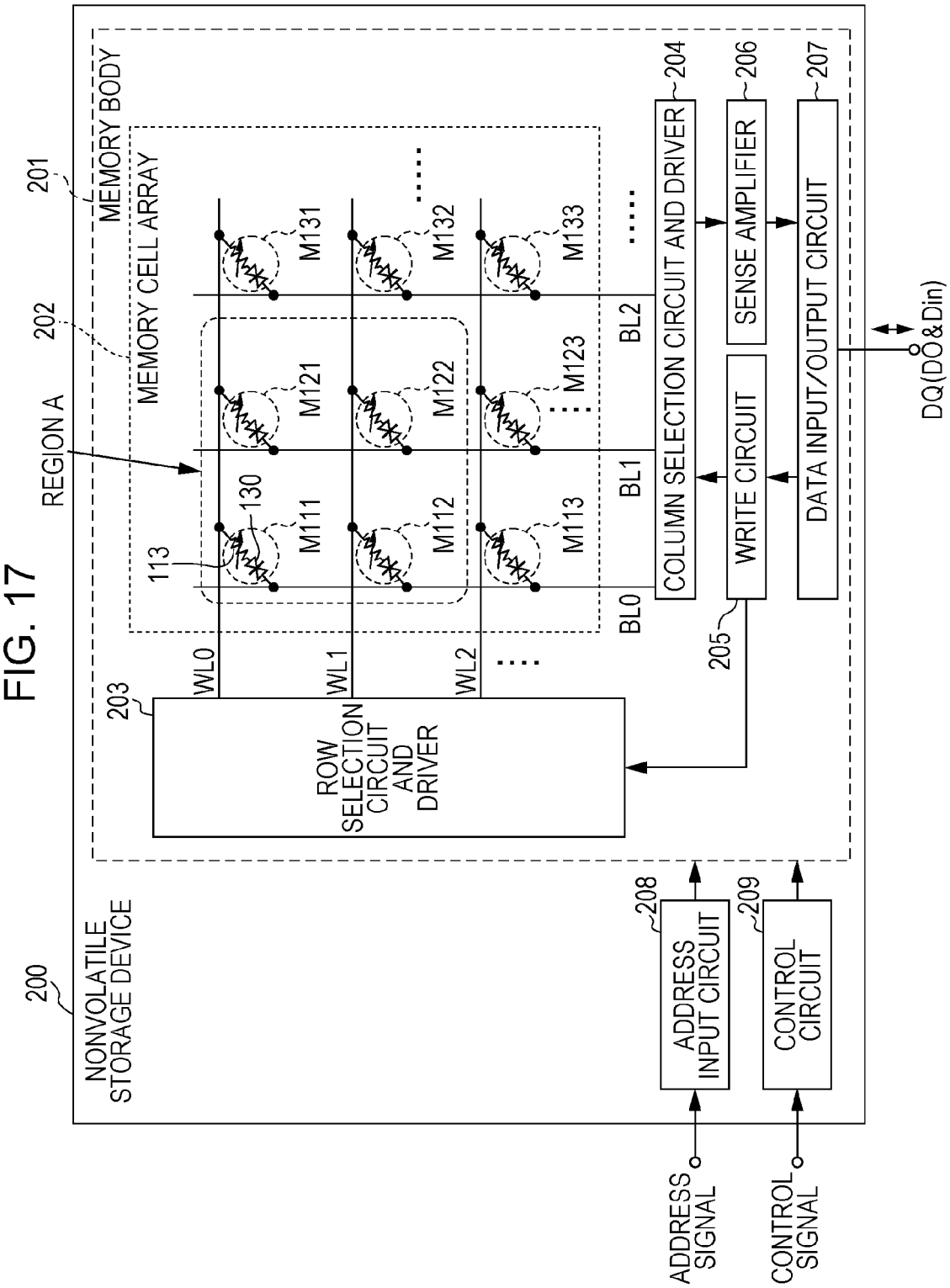
FIG. 17 is a block diagram illustrating one example of a configuration of a resistive nonvolatile storage apparatus according to a second embodiment.
Figure 18:
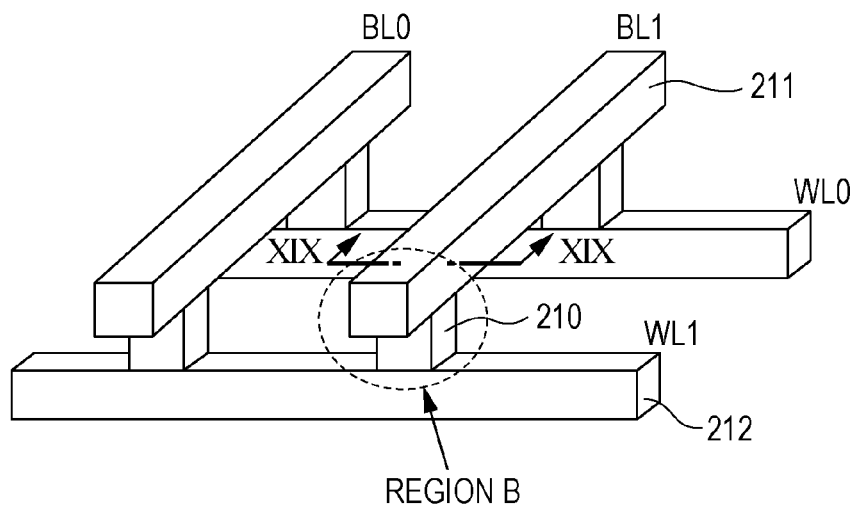
FIG. 18 is a perspective view illustrating one example of a configuration (corresponding to 4 bits) in a region A of the resistive nonvolatile storage apparatus illustrated in FIG. 17.

FIG. 17 is a block diagram illustrating a configuration of a resistive nonvolatile storage apparatus 200 according to the second embodiment in which the resistive nonvolatile storage devices 10 according to the first embodiment are employed. FIG. 18 is a perspective view illustrating a configuration (corresponding to 4 bits) in a region A of the resistive nonvolatile storage apparatus 200 illustrated in FIG. 17. The illustrated configuration represents a resistive nonvolatile storage apparatus including a memory cell of cross-point type in which a diode is electrically connected in series to each resistive nonvolatile storage device (resistance change element).

As illustrated in FIG. 17, the resistive nonvolatile storage apparatus 200 of this embodiment includes a memory body 201 on a semiconductor substrate. The memory body 201 includes a memory cell array 202, a row selection circuit and driver 203, a column selection circuit and driver 204, a write circuit 205 for writing information, a sense amplifier 206 that detects an amount of a current flowing through a selected bit line, and that determines whether data is "1" or "0", and a data input/output circuit 207 that executes input/output processing of input/output data through a terminal DQ. The resistive nonvolatile storage apparatus 200 further includes an address input circuit 208 that receives an address signal input from the outside, and a control circuit 209 that controls the operation of the memory body 201 in accordance with a control signal input from the outside.

As illustrated in FIGS. 17 and 18, the memory cell array 202 includes a plurality of word lines (first wirings) WL0, WL1, WL2, etc., which are formed on the semiconductor substrate parallel to one another, and a plurality of bit lines (second wirings) BL0, BL1, BL2, etc., which are formed above the plural word lines WL0, WL1, WL2, etc. in a state parallel to one another in a plane that is parallel to a principal surface of the semiconductor substrate, and in a state three-dimensionally crossing the plural word lines WL0, WL1, WL2, etc.

The memory cell array 202 further includes a plurality of memory cells M111, M112, M113, M121, M122, M123, M131, M132, M133, etc., which are disposed in a matrix pattern corresponding to three-dimensionally crossed points between the plural word lines WL0, WL1, WL2, etc. and the plural bit lines BL0, BL1, BL2, etc. The first metal wiring 104 in the first embodiment (FIG. 1) and the modification (FIGS. 16A to 16C) thereof corresponds to the word line in the second embodiment, and the second metal wiring 117 in the first embodiment (FIG. 1) and the modification (FIGS. 16A to 16C) thereof corresponds to the bit line in the second embodiment. The corresponding relation between those two types of lines may be reversed to the above-mentioned relation.

Each of the memory cells M111, M112, etc. includes a resistance change element 113 that constitutes the above-described resistive nonvolatile storage device 10 according to the first embodiment, and a current control element (diode) 130 that is connected in series to the resistance change element 113. Each resistance change element 113 includes a resistance change layer made of a metal oxide having a multilayer structure. The metal oxide having the multilayer structure may be an oxygen-deficient metal oxide.

Figure 19:
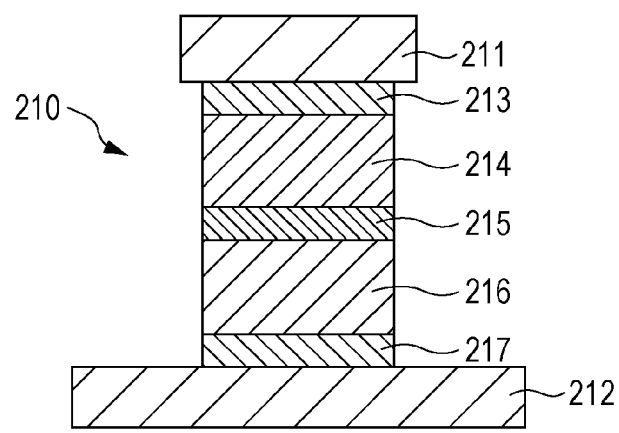
FIG. 19 is a sectional view illustrating one example of a configuration of a resistive nonvolatile storage device in the resistive nonvolatile storage apparatus illustrated in FIG. 18.

The memory cells M111, M112, etc. in FIG. 17 are each illustrated as a memory cell 210 in FIGS. 18 and 19.

[Configuration of Resistive Nonvolatile Storage Device]

FIG. 19 is a sectional view illustrating a configuration of the resistance change element 113 and the diode (current control element 130) in the resistive nonvolatile storage apparatus 200 illustrated in FIG. 17. Thus, FIG. 19 illustrates a configuration in a region B (specifically, a section taken along a line XIX-XIX in FIG. 18).

In the resistive nonvolatile storage apparatus 200 of the second embodiment, as illustrated in FIG. 19, the memory cell 210 is interposed between a lower wiring 212 (corresponding to the word line WL1 in FIG. 17) and an upper wiring 211 (corresponding to the bit line BL1 in FIG. 17), both the wirings 212 and 211 being made of copper. The memory cell 210 has a multilayer structure of a lower electrode 217, a current control layer 216, an inner electrode 215, a resistance change layer 214, and an upper electrode 213, which are successively stacked in the mentioned order.

Here, the inner electrode 215, the resistance change layer 214, and the upper electrode 213 correspond respectively to the lower electrode 110, the resistance change layer 111, and the upper electrode 112 in the resistive nonvolatile storage device 10 according to the first embodiment illustrated in FIG. 1. The resistance change element 113 is constituted by those three components. Hence the resistance change element 113 in this embodiment is formed in a similar manner to that in the first embodiment.

The current control layer 216 is connected in series to the resistance change layer 214 with the inner electrode 215, made of a tantalum nitride (TaN), interposed between them. The current control layer 216 and the resistance change layer 214 are electrically connected to each other. The current control element 130 constituted by the lower electrode 217, the current control layer 216, and the inner electrode 215 is an element represented by an MIM (Metal-Insulator-Metal) diode or an MSM (Metal-Semiconductor-Metal) diode, and it has a nonlinear electric characteristic with respect to voltage. The MSM diode allows a larger current to flow therethrough than the MIM diode. The current control layer 216 may be made of, e.g., amorphous Si. Furthermore, the current control element 130 has a bidirectional current characteristic with respect to voltage such that it is conducted at a predetermined threshold voltage Vf (for example, +1 V or more or −1V or less with one electrode being a reference).

Tantalum and a tantalum oxide are materials generally used in semiconductor processes, and they can be said as having very high affinity. Therefore, those materials can be easily employed in the existing semiconductor manufacturing processes.

[Example of Configuration Resistive Nonvolatile Storage Apparatus Having Multilayer Structure]

A resistive nonvolatile storage apparatus having a multilayer structure can be realized by three-dimensionally stacking the memory cell array in the resistive nonvolatile storage apparatus 200 according to the second embodiment illustrated in FIGS. 18 and 19.

Figure 20:
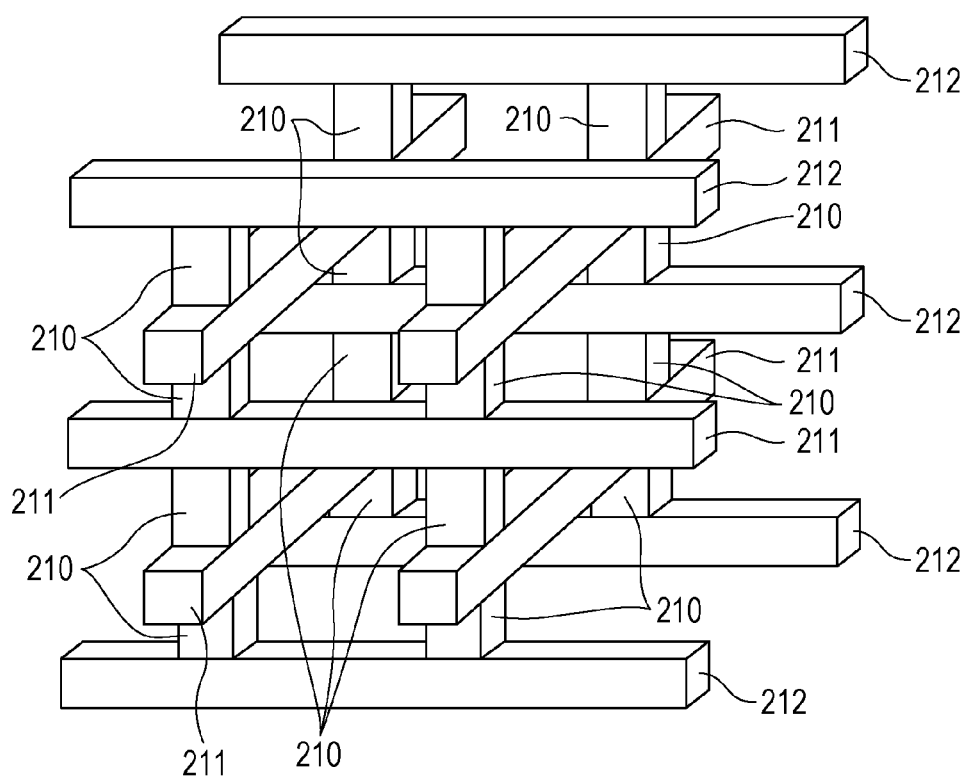
FIG. 20 is a perspective view illustrating one example of a configuration of a memory cell array having a multilayer structure that is obtained by forming the resistive nonvolatile storage apparatus, illustrated in FIG. 17, in multiple layers.

FIG. 20 is a perspective view illustrating a configuration of a memory cell array that is obtained by arranging, in a multilayer structure, the resistive nonvolatile storage apparatus 200 according to the second embodiment, illustrated in FIG. 17. As illustrated in FIG. 20, the resistive nonvolatile storage apparatus 200 includes a multilayer memory cell array formed by stacking a plurality of memory cell arrays in a multilayer structure. Each of the stacked memory cell arrays includes a plurality of lower wirings (first wirings) 212 that are formed on a not-illustrated semiconductor substrate parallel to one another, and a plurality of upper wirings (second wirings) 211 that are formed above the plural lower wirings 212 in a state parallel to one another in a plane that is parallel to a principal surface of the semiconductor substrate, and in a state three-dimensionally crossing the lower wirings 212, and a plurality of memory cells 210 that are disposed in a matrix pattern corresponding to three-dimensionally crossed points between the plural lower wirings 212 and the plural upper wirings 211.

While, in the example illustrated in FIG. 20, the number of wiring layers is five and the resistive nonvolatile storage devices arranged at the three-dimensionally crossed points of the wiring layers are disposed in four layers, it is a matter of course that the numbers of both the layers may be increased or decreased depending on demands.

A very large-capacity nonvolatile memory can be realized by disposing the multilayer memory cell array of the above-described configuration.

Moreover, the resistance change layer in this embodiment can be formed at low temperature. Accordingly, even when the multilayer structure is formed through the wiring steps described above in this embodiment, there is no risk of affecting transistors and wiring materials, such as silicide, which have been formed in the step of forming an underlying layer. Hence the multilayer memory cell array can be realized easily. In other words, the resistive nonvolatile storage apparatus of the multilayer structure can be easily realized by employing the resistance change layer containing the tantalum oxide according to the present disclosure.

Third Embodiment

A resistive nonvolatile storage apparatus will be described in which the resistive nonvolatile storage devices 10 according to the first embodiment are employed and one transistor serving as a current control element is electrically connected to each of the resistive nonvolatile storage devices.

The resistive nonvolatile storage apparatus according to a third embodiment includes: a semiconductor substrate; a plurality of first wirings and a plurality of second wirings, which are disposed on the semiconductor substrate and are disposed in mutually crossing relation; a plurality of resistive nonvolatile storage devices disposed respectively in areas that the plurality of first wirings and the plurality of second wirings form in a top view; and a plurality of current control devices disposed respectively in areas that the plurality of first wirings and the plurality of second wirings form in a top view, each of the plurality of current control devices controlling current corresponding to each of the plurality of resistive nonvolatile storage devices. The above-described resistive nonvolatile storage device 10 according to the first embodiment is used as each of the plurality of resistive nonvolatile storage devices. In this embodiment, a transistor is used as the current control element.

With the features described above, in the case of the resistive nonvolatile storage devices being arranged in the form of a memory array, even when polishing (e.g., CMP) of a conductive layer, which constitutes a plug material, is performed in a step of forming the contact plugs, the conductive layer is polished in a state where the close contact layer covering a part of the upper surface of the interlayer insulating layer remains, on which part the contact plug is formed. Accordingly, the interlayer insulating layer is not polished, and surface unevenness (so-called global level difference), including the level difference in the end portion of the memory array region and the recess in the surface of the interlayer insulating layer, can be suppressed. As a result, variations in characteristics of a large-capacity resistive nonvolatile storage apparatus of 1T1R type, which employs many resistive nonvolatile storage devices, can be reduced.

[Configuration of Resistive Nonvolatile Storage Apparatus]

Figure 21:
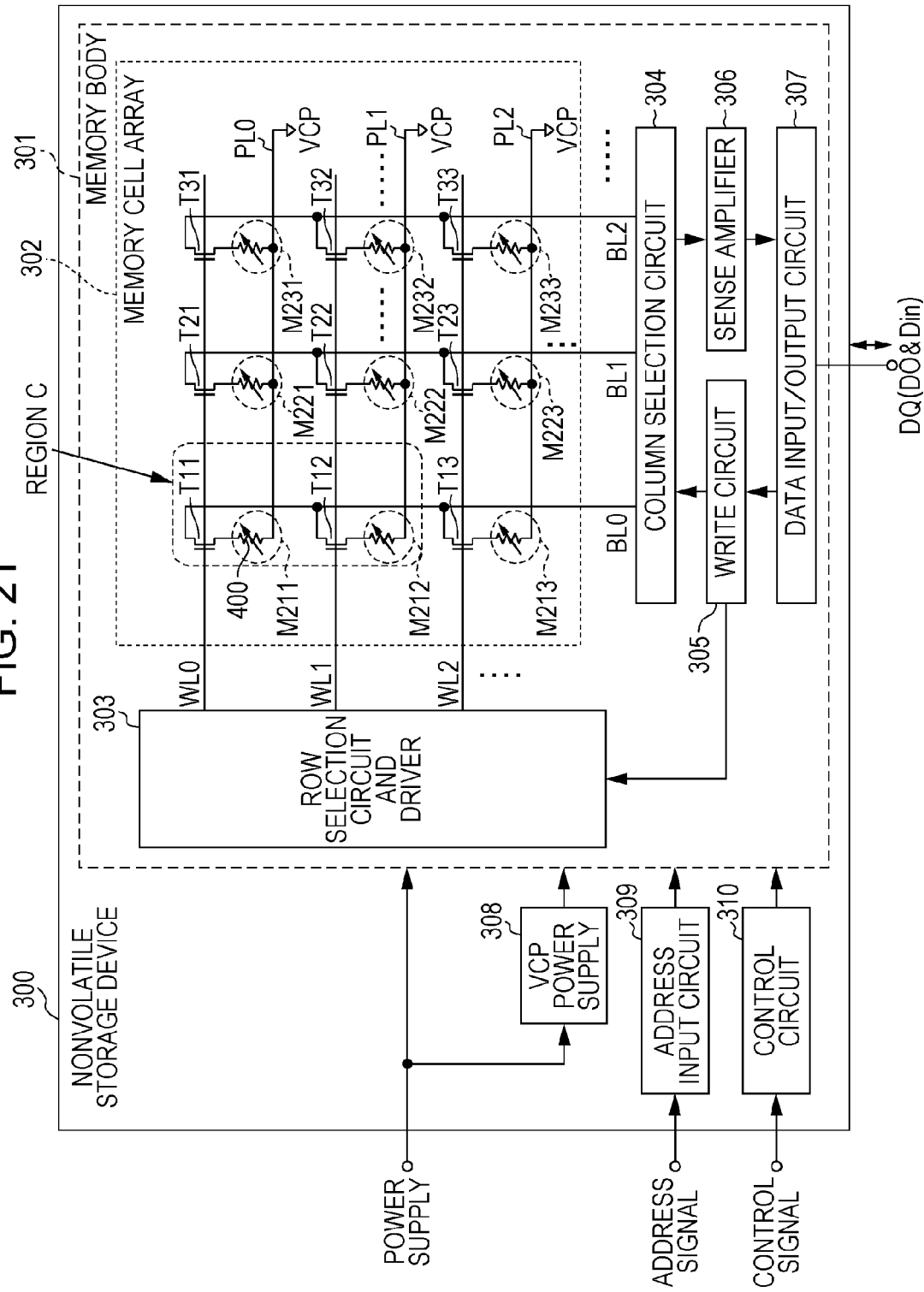
FIG. 21 is a block diagram illustrating one example of a configuration of a resistive nonvolatile storage apparatus according to a third embodiment.
Figure 22:
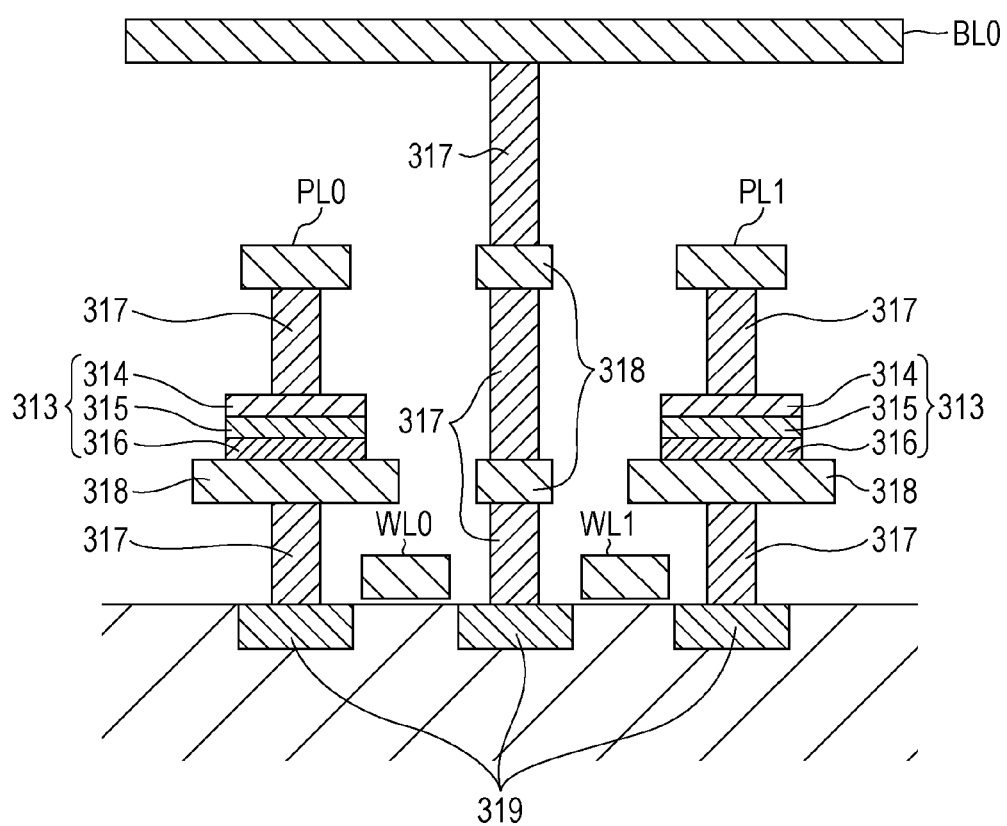
FIG. 22 is a sectional view illustrating a configuration (corresponding to 2 bits) in a region C of the resistive nonvolatile storage apparatus illustrated in FIG. 21.

FIG. 21 is a block diagram illustrating a configuration of a resistive nonvolatile storage apparatus 300 according to the third embodiment in which the resistive nonvolatile storage devices 10 according to the first embodiment are employed. FIG. 22 is a sectional view illustrating a configuration (corresponding to 2 bits) in a region C of the resistive nonvolatile storage apparatus 300 illustrated in FIG. 21. The illustrated configuration represents a resistive nonvolatile storage apparatus including a memory cell of 1T1R (1 transistor 1 resistance change element) type in which a transistor is electrically connected in series to each resistive nonvolatile storage device (resistance change element).

As illustrated in FIG. 21, the resistive nonvolatile storage apparatus 300 of this embodiment includes a memory body 301 on a semiconductor substrate. The memory body 301 includes a memory cell array 302, a row selection circuit and driver 303, a column selection circuit 304, a write circuit 305 for writing information, a sense amplifier 306 that detects an amount of a current flowing through a selected bit line, and that determines whether data is "1" or "0", and a data input/output circuit 307 that executes input/output processing of input/output data through a terminal DQ. The resistive nonvolatile storage apparatus 300 further includes a cell plate power supply (VCP power supply) 308, an address input circuit 309 that receives an address signal input from the outside, and a control circuit 310 that controls the operation of the memory body 301 in accordance with a control signal input from the outside.

The memory cell array 302 includes a plurality of word lines (first wirings) WL0, WL1, WL2, etc. and a plurality of bit lines (second wirings) BL0, BL1, BL2, etc., which are both formed on the semiconductor substrate parallel to one another, and which are formed in a state crossing each other, a plurality of transistors T11, T12, T13, T21, T22, T23, T31, T32, T33, etc., which are disposed respectively corresponding to crossed points between the word lines WL0, WL1, WL2, etc. and the bit lines BL0, BL1, BL2, etc., and a plurality of memory cells M211, M212, M213, M221, M222, M223, M231, M232, M233, etc., which are disposed in one-to-one relation to the transistors T11, T12, etc. The first metal wiring 104 in the first embodiment (FIG. 1) and the modification (FIGS. 16A to 16C) thereof corresponds to the word line in the third embodiment, and the second metal wiring 117 in the first embodiment (FIG. 1) and the modification (FIGS. 16A to 16C) thereof corresponds to the bit line in the third embodiment. The corresponding relation between those two types of lines may be reversed to the above-mentioned relation.

The memory cell array 302 further includes a plurality of plate lines (third wirings) PL0, PL1, PL2, etc., which are arrayed parallel to the word lines WL0, WL1, WL2, etc. As illustrated in FIG. 22, the bit line BL0 is arranged above the word lines WL0 and WL1, and the plate lines PL0 and PL1 are arranged between the word lines WL0 and WL1 and the bit line BL0. While, in the arrangement described above, the plate lines are disposed parallel to the word lines, the plate lines may be arranged parallel to the bit lines. Furthermore, while, in the illustrated example, the plate lines are arranged to apply a common potential to the transistors, a plate line selection circuit and driver having a similar configuration to that of the row selection circuit and driver may be disposed such that selected plate lines and not-selected plate lines are driven at different voltages (including polarities).

Each of the memory cells M211, M212, etc. corresponds to the above-described resistive nonvolatile storage device 10 according to the first embodiment, and each resistive nonvolatile storage device 10 includes a resistance change layer made of a metal oxide having a multilayer structure. The metal oxide having the multilayer structure may be an oxygen-deficient metal oxide.

More specifically, a resistive nonvolatile storage device 313 in FIG. 22 corresponds to a resistance change element 400 in the memory cells M211, M212, etc. in FIG. 21. The resistance change element 400 in each of the memory cells M211, M212, etc. is constituted by the above-described resistive nonvolatile storage device 10 according to the first embodiment. The resistive nonvolatile storage device 313 is constituted by an upper electrode 314, a resistance change layer 315 made of a metal oxide having a multilayer structure, and a lower electrode 316. In addition to the resistive nonvolatile storage device 313, FIG. 22 further illustrates a plug layer 317, a metal wiring layer 318, and a source or drain region 319.

As illustrated in FIG. 21, drains of the transistors T11, T12, T13, etc. are connected to the bit line BL0, drains of the transistors T21, T22, T23, etc. are connected to the bit line BL1, and drains of the transistors T31, T32, T33, etc. are connected to the bit line BL2, respectively.

Gates of the transistors T11, T21, T31, etc. are connected to the word line WL0, gates of the transistors T12, T22, T32, etc. are connected to the word line WL1, and gates of the transistors T13, T23, T33, etc. are connected to the word line WL2, respectively.

Sources of the transistors T11, T12, etc. are connected to the memory cells M211, M212, etc., respectively.

The memory cells M211, M221, M231, etc. are connected to the plate line PL0, the memory cells M212, M222, M232, etc. are connected to the plate line PL1, and the memory cells M213, M223, M233, etc. are connected to the plate line PL2, respectively.

The address input circuit 309 receives an address signal from an external circuit (not illustrated). In accordance with the address signal, the address input circuit 309 outputs a row address signal to the row selection circuit and driver 303, and further outputs a column address signal to the column selection circuit 304. Here, the address signal is a signal indicating an address of a specific memory cell selected from the plural memory cells M211, M212, etc. The row address signal is a signal indicating a row address in the address indicated by the address signal, and the column address signal is a signal indicating a column address in the address indicated by the address signal.

In an information write cycle, the control circuit 310 outputs a write signal, which instructs application of a write voltage, to the write circuit 305 in accordance with input data Din that is input to the data input/output circuit 307. On the other hand, in an information read cycle, the control circuit 310 outputs a read signal, which instructs application of a read voltage, to the column selection circuit 304.

The row selection circuit and driver 303 receives the row address signal output from the address input circuit 309, selects one of the plural word lines WL0, WL1, WL2, etc. in accordance with the row address signal, and applies a predetermined voltage to the selected word line.

The column selection circuit 304 receives the column address signal output from the address input circuit 309, selects one of the plural bit lines BL0, BL1, BL2, etc. in accordance with the column address signal, and applies a write voltage or a read voltage to the selected bit line.

When the write circuit 305 receives the write signal output from the control circuit 310, the write circuit 305 outputs, to the column selection circuit 304, a signal that instructs application of the write voltage to the selected bit line.

In the information read cycle, the sense amplifier 306 detects an amount of a current flowing through the selected bit line, which is a read target, and determines whether data is "1" or "0". Resulting output data DO is output to an external circuit through the data input/output circuit 307.

In the third embodiment in which the resistive nonvolatile storage device has the 1T1R type structure, a storage capacity is reduced in comparison with that in the second embodiment in which the resistive nonvolatile storage device has the cross-point type structure. However, the third embodiment is advantageous in that, because of not employing the current control element, such as a diode, combination with the CMOS process can be facilitated, and operation control can also be facilitated.

As in the second embodiment, the resistance change layer in the third embodiment can be formed at low temperature. Accordingly, another advantage is obtained in that, even when the multilayer structure is formed through the wiring steps described above in the third embodiment, there is no risk of affecting transistors and wiring materials, such as silicide, which have been formed in the step of forming an underlying layer.

Moreover, as in the second embodiment, since tantalum and a tantalum oxide are materials that can be easily incorporated into the existing semiconductor manufacturing processes, the resistive nonvolatile storage apparatus according to the third embodiment can be manufactured easily from practical point of view.

While the foregoing embodiments have been described in connection with the case where the metal oxide of the resistance change layer is a tantalum oxide, a hafnium oxide, or a zirconium oxide, it is just to be satisfied for a metal oxide layer sandwiched between the lower electrode and the upper electrode that an oxide layer of tantalum, hafnium, or zirconium, for example, is included as a main resistance change layer developing the resistance change. The resistance change layer may contain, e.g., a minute amount of other element than those mentioned above. A minute amount of any other element may be intentionally contained for the purpose of fine adjustment of the resistance value, for example. Even such a case is also involved within the scope of the present disclosure. Adding, e.g., nitrogen to the resistance change layer increases the resistance value of the resistance change layer and improves responsivity of the resistance change.

When the resistance change layer is formed by sputtering, a minute amount of an unintended element may be mixed into the resistance change layer due to the presence of residual gas or gas release from the wall of a vacuum vessel. Even such a case of mixing of the minute amount of the unintended element into the resistance change layer is also of course involved within the scope of the present disclosure.

While the resistive nonvolatile storage device, the manufacturing method for the same, and the resistive nonvolatile storage apparatus according to the present disclosure have been described above in connection with the first to third embodiments, the present disclosure is not limited to the first to third embodiments. Various modifications of the embodiments, which are conceivable by those skilled in the art, and various configurations resulting from combining the components in the different embodiments are also involved within the scope of the present disclosure.

What is claimed is:

1. A method for manufacturing a resistive nonvolatile storage device, the method comprising:
    forming a first insulating layer above a substrate;
    opening a contact hole through the first insulating layer;
    forming a contact layer along a bottom and an inner sidewall of the contact hole and along an upper surface of the first insulating layer, so that the contact layer includes a first portion covering the bottom of the contact hole, a second portion being in direct contact with the inner sidewall of the contact hole, and a third portion covering the upper surface of the first insulating layer;
    depositing a conductive layer on the contact layer,
    polishing the conductive layer to expose the third portion of the contact layer and to cause an upper surface of the conductive layer to be positioned below the upper surface of the third portion of the contact layer in the contact hole;
    forming a lower electrode layer on the third portion of contact layer and on a contact plug that is composed of the conductive layer in the contact hole;
    after forming the lower electrode layer, polishing an upper surface of the lower electrode layer until a film thickness of the lower electrode layer is larger in a region of the lower electrode layer above the contact plug than in a region of the lower electrode layer above the third portion of the contact layer, and planarizing an upper surface of the lower electrode layer;
    forming a resistance change layer on the planarized lower electrode layer;
    forming an upper electrode layer on the resistance change layer; and simultaneously etching the upper electrode layer, the resistance change layer, the lower electrode layer, and the third portion of the contact layer, so that respective side surfaces of the upper electrode layer, the resistance change layer, the lower electrode layer, and the third portion of the contact layer are present in a same plane.

2. The method according to claim 1, further comprising:

before forming the first insulating layer, forming a second insulating layer on the substrate;

forming a first wiring in the second insulating layer; and after forming the resistance change layer, forming a second wiring connected to the upper electrode, wherein, in the forming the contact layer, the contact layer is formed on the first wiring, so that the upper surface of the first wiring comes in direct contact with the first portion of the contact layer.

3. The method according to claim 1, wherein the forming the lower electrode layer includes:

depositing a first lower electrode layer on both the third portion of the contact layer and the conductive layer;

polishing an upper surface of the first lower electrode layer to planarize the upper surface of the first lower electrode layer; and depositing a second lower electrode layer on the planarized first lower electrode layer.

4. The method according to claim 1, wherein the forming the resistance change layer includes:

forming a first metal oxide layer comprising an oxygen-deficient metal oxide; and forming a second metal oxide layer having a lower degree of oxygen deficiency than oxygen deficiency of the first metal oxide layer.

5. The method according to claim 2, wherein the forming the first wiring includes:

forming a first wiring groove in the second insulating layer; and burying a first wiring material in the first wiring groove, and wherein the forming the second wiring includes:

forming a third insulating layer on a side surface and an upper surface of the resistance change element, and on the first insulating layer;

forming a second wiring groove in the third insulating layer; and burying a second wiring material in the second wiring groove.

* * * * *